US012813035B2

(12) United States Patent
Noami et al.

(10) Patent No.: US 12,813,035 B2
(45) Date of Patent: Nov. 24, 2026

(54) PLANAR LIGHT SOURCE

(71) Applicant: NICHIA CORPORATION, Anan (JP)

(72) Inventors: Shunsuke Noami, Tokushima (JP); Kakeru Inoue, Anan (JP)

(73) Assignee: NICHIA CORPORATION, Anan (JP)

( * ) Notice: Subject to any disclaimer, the term of this patent is extended or adjusted under 35 U.S.C. 154(b) by 358 days.

(21) Appl. No.: 18/426,818

(22) Filed: Jan. 30, 2024

(65) Prior Publication Data

US 2024/0258471 A1 Aug. 1, 2024

(30) Foreign Application Priority Data

Jan. 31, 2023 (JP) ................................ 2023-013315
Aug. 31, 2023 (JP) ................................ 2023-141497

(51) Int. Cl.
*H10H 20/851* (2025.01)
*H10H 20/856* (2025.01)
*H10W 90/00* (2026.01)

(52) U.S. Cl.
CPC ...... *H10H 20/8515* (2025.01); *H10H 20/856* (2025.01); *H10W 90/00* (2026.01)

(58) Field of Classification Search
None
See application file for complete search history.

(56) References Cited

U.S. PATENT DOCUMENTS

2008/0074032 A1 3/2008 Yano et al.
2013/0200413 A1 8/2013 Kashiwagi et al.
2015/0129919 A1 5/2015 Liu et al.
2015/0194580 A1 7/2015 Lowes et al.
(Continued)

FOREIGN PATENT DOCUMENTS

CN 106935697 A 7/2017
EP 3 920 247 A1 12/2021
(Continued)

OTHER PUBLICATIONS

Non-Final Office Action in U.S. Appl. No. 18/426,841 dated Mar. 25, 2026.
(Continued)

*Primary Examiner* — Bo B Jang
(74) *Attorney, Agent, or Firm* — Foley & Lardner LLP

(57) ABSTRACT

The planar light source includes a light-emitting device including a light-emitting element provided with an element portion and an electrode disposed on a lower surface of the element portion, a wavelength conversion member disposed on an upper surface and a lateral surface of the element portion, a light-transmissive member disposed on an upper surface of the wavelength conversion member, and a first light reflective member disposed on lower surfaces of the element portion and the wavelength conversion member; a substrate; and a second light reflective member disposed on an upper surface of the substrate and provided with an opening. The light-emitting device is disposed on the upper surface of the substrate in the opening, and the upper surface of the substrate includes an exposed portion exposed from the light-emitting device in the opening. A thickness of the light-transmissive member is larger than a thickness of the wavelength conversion member.

10 Claims, 16 Drawing Sheets

(56) References Cited

U.S. PATENT DOCUMENTS

| | | | |
|---|---|---|---|
| 2016/0190405 | A1 | 6/2016 | Yamada et al. |
| 2016/0254428 | A1 | 9/2016 | Ting et al. |
| 2017/0122529 | A1 | 5/2017 | Yamada |
| 2017/0222102 | A1 | 8/2017 | Cheng et al. |
| 2017/0330998 | A1 | 11/2017 | Park et al. |
| 2017/0331003 | A1 | 11/2017 | Cheng et al. |
| 2018/0180249 | A1 | 6/2018 | Yamada et al. |
| 2018/0261734 | A1 | 9/2018 | Herrmann et al. |
| 2019/0094618 | A1 | 3/2019 | Kyoukane et al. |
| 2019/0165225 | A1 | 5/2019 | Kuhnelt et al. |
| 2019/0285945 | A1 | 9/2019 | Kyoukane et al. |
| 2020/0194639 | A1 | 6/2020 | Hashimoto |
| 2020/0209458 | A1 | 7/2020 | Yuu |
| 2021/0088844 | A1 | 3/2021 | Kasai |
| 2021/0239296 | A1 | 8/2021 | Nakabayashi et al. |
| 2021/0364857 | A1 | 11/2021 | Ogawa |
| 2021/0382354 | A1* | 12/2021 | Shinomiya ........ G02F 1/133612 |
| 2021/0384377 | A1 | 12/2021 | Imahori |
| 2022/0066088 | A1 | 3/2022 | Emura et al. |
| 2022/0137458 | A1 | 5/2022 | Liu et al. |
| 2022/0140209 | A1 | 5/2022 | Hashimoto |
| 2022/0190214 | A1 | 6/2022 | Iwamoto et al. |
| 2022/0199878 | A1 | 6/2022 | Hashimoto |

FOREIGN PATENT DOCUMENTS

| | | | |
|---|---|---|---|
| JP | 2010-067641 | A | 3/2010 |
| JP | 2011-165434 | A | 8/2011 |
| JP | 2013-038353 | A | 2/2013 |
| JP | 2013-159004 | A | 8/2013 |
| JP | 2015-095658 | A | 5/2015 |
| JP | 2016-015474 | A | 1/2016 |
| JP | 2016-119454 | A | 6/2016 |
| JP | 2016-154204 | A | 8/2016 |
| JP | 2017-028190 | A | 2/2017 |
| JP | 2017-092021 | A | 5/2017 |
| JP | 2017-139464 | A | 8/2017 |
| JP | 2017-157278 | A | 9/2017 |
| JP | 2018-514950 | A | 6/2018 |
| JP | 2018-107279 | A | 7/2018 |
| JP | 2019-061929 | A | 4/2019 |
| JP | 6544076 | B2 | 7/2019 |
| JP | 2019-160688 | A | 9/2019 |
| JP | 2020-098832 | A | 6/2020 |
| JP | 2020-107865 | A | 7/2020 |
| JP | 2020-109745 | A | 7/2020 |
| JP | 2020-181879 | A | 11/2020 |
| JP | 2021-057574 | A | 4/2021 |
| JP | 2021-125453 | A | 8/2021 |
| JP | 2021-170610 | A | 10/2021 |
| JP | 2021-190158 | A | 12/2021 |
| JP | 2021-192357 | A | 12/2021 |
| JP | 3235664 | U | 1/2022 |
| JP | 2022-022648 | A | 2/2022 |
| JP | 2022-041836 | A | 3/2022 |
| JP | 2022-072423 | A | 5/2022 |
| JP | 2022-094286 | A | 6/2022 |
| JP | 2022-098401 | A | 7/2022 |
| JP | 2023-049463 | A1 | 4/2023 |
| WO | WO-2005/104247 | A1 | 11/2005 |

OTHER PUBLICATIONS

Notice of Allowance in U.S. Appl. No. 18/426,841 dated Jul. 31, 2026.

* cited by examiner

| MODEL No. | THICKNESS x1 OF LIGHT-TRANSMISSIVE MEMBER [μm] | THICKNESS x2 OF WAVELENGTH CONVERSION MEMBER [μm] | AREA x3 OF EXPOSED PORTION [$mm^2$] | MEASURED VALUE OF UNEVENNESS VALUE | PREDICTED VALUE OF UNEVENNESS VALUE |
|---|---|---|---|---|---|
| 1 | 600 | 300 | 0 | 1.0023 | 1.0004 |
| 2 | 600 | 450 | 0.48 | 1.0003 | 0.9978 |
| 3 | 600 | 600 | 1.35 | 0.9881 | 0.9952 |
| 4 | 750 | 450 | 0.48 | 0.9956 | 0.9938 |
| 5 | 750 | 600 | 1.35 | 0.9900 | 0.9912 |
| 6 | 750 | 300 | 0 | 0.9978 | 0.9964 |
| 7 | 900 | 300 | 1.35 | 0.9939 | 0.9923 |
| 8 | 900 | 450 | 0 | 0.9960 | 0.9897 |
| 9 | 900 | 600 | 0.48 | 0.9834 | 0.9871 |
| 10 | 600 | 600 | 0.48 | 0.9933 | 0.9952 |
| 11 | 600 | 300 | 1.35 | 1.0010 | 1.0004 |
| 12 | 600 | 450 | 0 | 0.9999 | 0.9978 |
| 13 | 750 | 600 | 0 | 0.9925 | 0.9912 |
| 14 | 750 | 300 | 0.48 | 1.0008 | 0.9964 |
| 15 | 750 | 450 | 1.35 | 0.9898 | 0.9938 |
| 16 | 900 | 450 | 1.35 | 0.9880 | 0.9897 |
| 17 | 900 | 600 | 0 | 0.9902 | 0.9871 |
| 18 | 900 | 300 | 0.48 | 0.9908 | 0.9923 |
| 19 | 700 | 350 | 0.48 | 1.0021 | 0.9968 |
| 20 | 350 | 350 | 0.48 | 1.0107 | 1.0063 |
| 21 | 300 | 600 | 0 | 1.0053 | 1.0033 |
| 22 | 300 | 150 | 1.35 | 1.0110 | 1.0111 |
| 23 | 300 | 150 | 1.35 | 1.0059 | 1.0111 |
| 24 | 300 | 600 | 1.35 | 0.9992 | 1.0033 |
| 25 | 300 | 150 | 0 | 1.0111 | 1.0111 |
| 26 | 900 | 150 | 1.35 | 0.9857 | 0.9949 |
| 27 | 900 | 150 | 1.35 | 0.9943 | 0.9949 |
| 28 | 300 | 150 | 0 | 1.0129 | 1.0111 |

FIG. 7

PLANAR LIGHT SOURCE

CROSS-REFERENCE TO RELATED APPLICATION

This application claims priority to Japanese Patent Application No. 2023-013315, filed on Jan. 31, 2023, and Japanese Patent Application No. 2023-141497, filed on Aug. 31, 2023, the disclosures of which are hereby incorporated by reference in their entireties.

TECHNICAL FIELD

The present disclosure relates to a planar light source.

BACKGROUND

For example, Japanese Patent Publication No. 2016-154204 discloses a light-emitting device having batwing light distribution characteristics.

SUMMARY

An object of the present disclosure is to provide a planar light source in which luminance unevenness can be reduced.

According to an aspect of the present disclosure, a planar light source includes a light-emitting device including a light-emitting element provided with an element portion and an electrode disposed on a lower surface of the element portion, a wavelength conversion member disposed on an upper surface and a lateral surface of the element portion, a light-transmissive member disposed on an upper surface of the wavelength conversion member, and a first light reflective member disposed on the lower surface of the element portion and a lower surface of the wavelength conversion member; a substrate; and a second light reflective member disposed on an upper surface of the substrate and provided with an opening. The light-emitting device is disposed on the upper surface of the substrate in the opening, and the upper surface of the substrate includes an exposed portion exposed from the light-emitting device in the opening. A lateral surface of the wavelength conversion member is exposed from the light-transmissive member, and a thickness of the light-transmissive member is larger than a thickness of the wavelength conversion member.

According to an aspect of the present disclosure, a planar light source includes a light-emitting device including a light-emitting element provided with an element portion and an electrode disposed on a lower surface of the element portion, a wavelength conversion member disposed on an upper surface and a lateral surface of the element portion, a light-transmissive member disposed on an upper surface of the wavelength conversion member and including a light-diffusing material, and a device-lateral surface including a lateral surface of the wavelength conversion member and a lateral surface of the light-transmissive member; a substrate; and a second light reflective member disposed on an upper surface of the substrate and provided with an opening. The light-emitting device is disposed on the upper surface of the substrate in the opening, and the upper surface of the substrate includes an exposed portion exposed from the light-emitting device in the opening.

A thickness of the light-transmissive member is larger than a thickness of the wavelength conversion member. The light-emitting device has a light distribution characteristic of having a first luminous intensity peak higher than a luminous intensity when a light distribution angle is 0°, in a range of a light distribution angle of 0° to −90°, and a second luminous intensity peak higher than a luminous intensity when the light distribution angle is 0°, in a range of a light distribution angle of 0° to 90°.

The present disclosure can provide a planar light source in which luminance unevenness can be reduced.

BRIEF DESCRIPTION OF DRAWINGS

FIG. 7 is a table showing a relationship between a predicted value and a measured value of an unevenness value.

DETAILED DESCRIPTIONS

Figure 1:
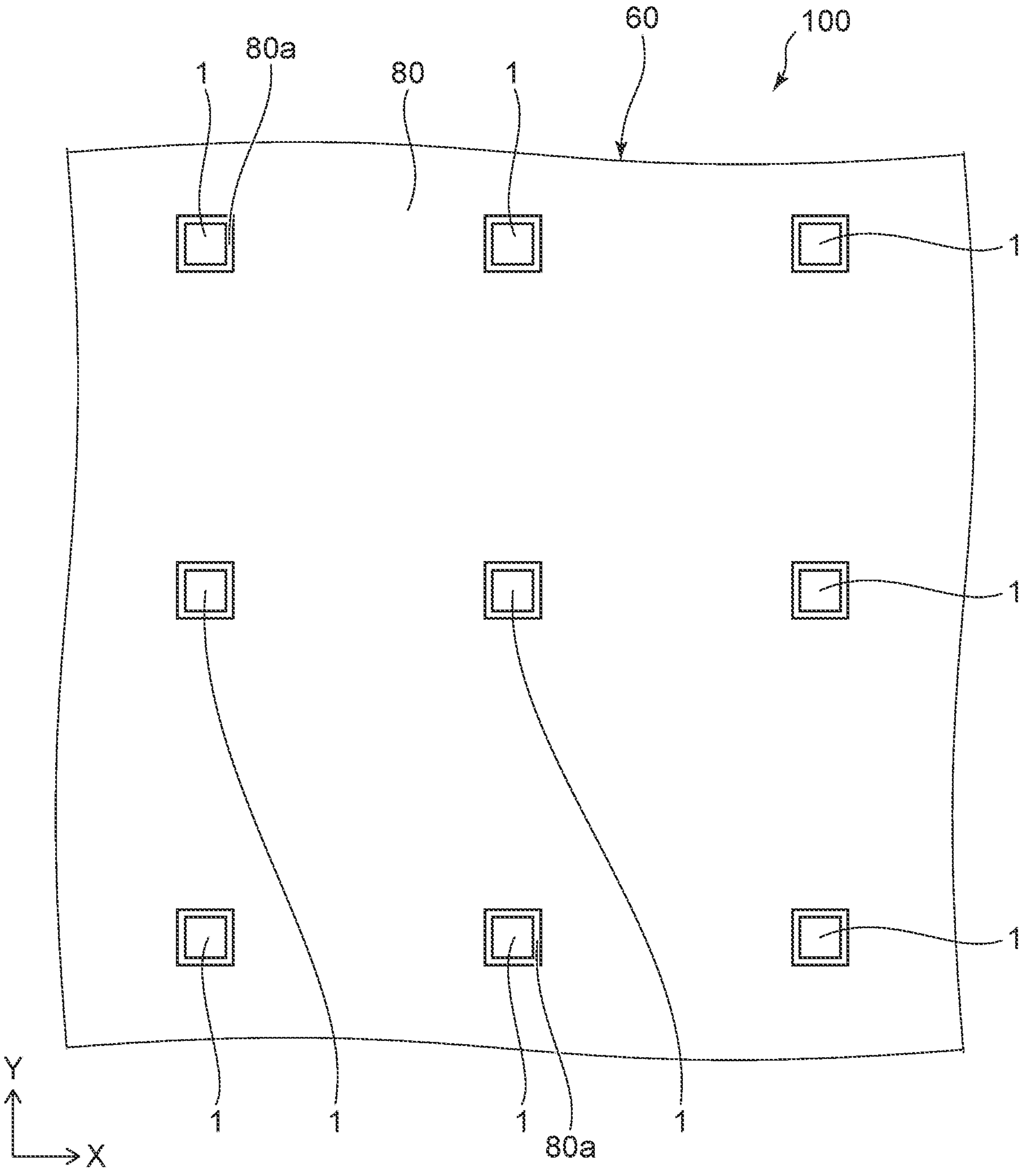
FIG. 1 is a schematic top view of a planar light source of an embodiment.

Planar light sources of embodiments are described below with reference to the drawings. Dimensions, materials, shapes, relative arrangements, or the like of constituent members described in the embodiments are not intended to limit the scope of the present disclosure thereto unless otherwise specified, and are merely exemplary. The sizes, positional relationship, or the like of members illustrated in each of the drawings may be exaggerated for clarity of description. Furthermore, in the following description, members having the same names and reference numerals represent the same or similar members, and detailed description of these members is omitted as appropriate. As a cross-sectional view, an end view illustrating only a cut surface may be illustrated.

In the following description, terms indicating specific directions or positions (for example, "upper/upward," "lower/downward," and other terms including or related to those terms) may be used. However, these terms are used merely to make it easy to understand relative directions or positions in the referenced drawing. As long as the relative direction or position is the same as that described in the referenced drawing using the term such as "upper/upward" or "lower/downward," in drawings other than the drawings of the present disclosure, actual products, and the like, members need not be arranged in the same manner as that in the referenced drawing. For example, on the assumption that there are two members, the positional relationship expressed as "upper (or lower)" in the present specification may include a case in which the two members are in contact with each other and a case in which the two members are not in contact with each other and one of the two members is located above (or below) the other member. Furthermore, unless otherwise specified, a case in which a member covers an object to be covered includes a case in which the member is in contact with the object to be covered and directly covers the object to be covered, and a case in which the member is not in contact with the object to be covered and indirectly covers the object to be covered.

As illustrated in FIG. 1, a planar light source 100 of an embodiment includes a plurality of light-emitting devices 1, a substrate 60, and a second light reflective member 80. The plurality of light-emitting devices 1 are disposed on an upper surface of the substrate 60. The plurality of light-emitting devices 1 can be disposed on the upper surface of the substrate 60, for example, in a square lattice point pattern. The plurality of light-emitting devices 1 may be disposed on the upper surface of the substrate 60 in a checkerboard lattice point pattern.

The second light reflective member 80 is disposed on the upper surface of the substrate 60 and has a plurality of openings 80*a*. The second light reflective member 80 has reflectivity to light emitted from the light-emitting device 1. The second light reflective member 80 reflects light emitted from the light-emitting device 1 and directed toward the second light reflective member 80 disposed in a region not provided with the light-emitting device 1. Thus, the luminance of the region of the planar light source 100 where no light-emitting device 1 is located can be improved, thereby reducing luminance unevenness on a light-emitting surface of the planar light source 100. A material of the second light reflective member 80 is described below.

Figure 2:
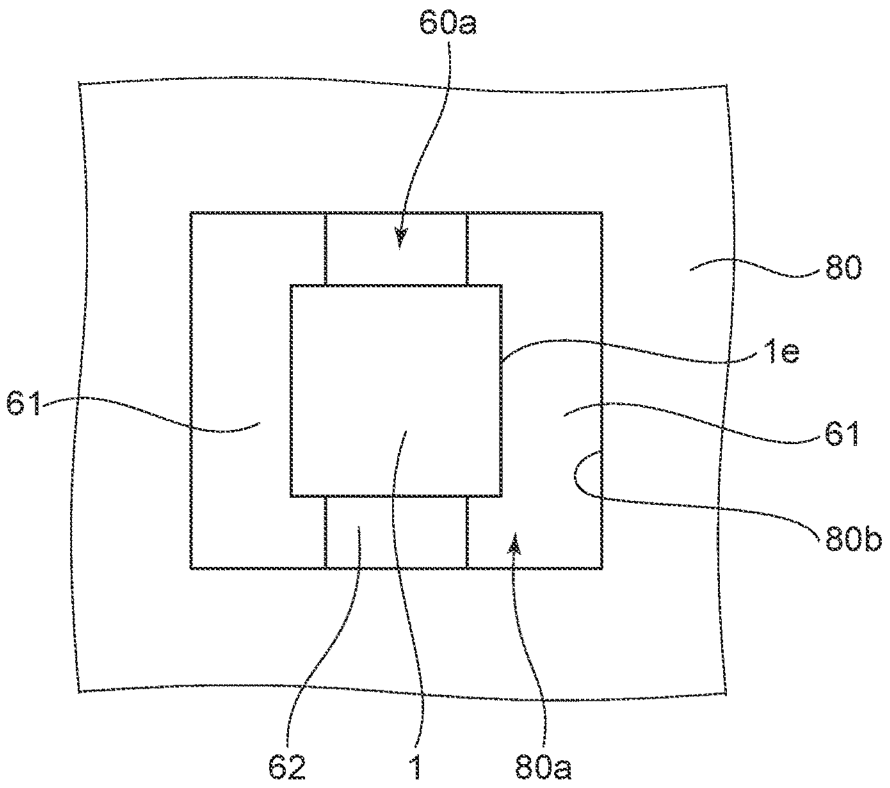
FIG. 2 is an enlarged schematic top view illustrating a region provided with one light-emitting device in FIG. 1.

FIG. 2 is an enlarged schematic top view illustrating a region provided with one of the light-emitting devices 1 in FIG. 1. The substrate 60 includes, for example, at least an insulating base material and a wiring for electrically connecting the light-emitting device 1 to an external power supply or the like. The substrate 60 includes a conductive portion 61 on the insulating base material, as a part of the wiring. In a region provided with one light-emitting device 1, two conductive portions 61 are disposed apart from each other. An insulating portion 62 is located between these two conductive portions 61. Examples of the insulating base material include ceramics, resins, and composite materials. Examples of the resins include phenol resin, epoxy resin, polyimide resin, BT resin, polyphthalamide (PPA), and polyethylene terephthalate (PET). Examples of the composite materials include mixtures of any of the above-mentioned resins and any of reflective materials such as glass fiber, $TiO_2$, $Al_2O_3$, $SiO_2$, $ZrO_2$, MgO, and ZnO, a glass fiber reinforced resin (glass epoxy resin), and a metal substrate in which a metal member is coated with an insulating layer. An example of a material of the conductive portion 61 that can be used includes a metal such as copper. As the insulating portion 62, an insulating base material itself, a third base material (described below) disposed on the insulating base material, a combination of the third base material and a second additive, or the like can be used.

The upper surface of the substrate 60 includes an exposed portion 60*a* that is exposed from the light-emitting device 1 and the second light reflective member 80 in the opening 80*a* of the second light reflective member 80. In top view, the exposed portion 60*a* is a region between an outer edge 1*e* of the light-emitting device 1 and an inner edge 80*b* defining the opening 80*b* in the second light reflective member 80. In top view, the exposed portion 60*a* is a region of the opening 80*a* of the second light reflective member 80 where the light-emitting device 1 is not located. The exposed portion 60*a* includes an upper surface of the conductive portion 61 and an upper surface of the insulating portion 62. The reflectance of the exposed portion 60*a* with respect to light emitted by the light-emitting device 1 is lower than the reflectance of the second light reflective member 80 with respect to the light emitted by the light-emitting device 1. Moreover, the reflectance of the insulating portion 62 of the exposed portion 60*a* with respect to the light emitted by the light-emitting device 1 is lower than the reflectance of the second light reflective member 80 with respect to the light emitted by the light-emitting device 1.

The light-emitting device 1 is disposed on the upper surface of the substrate 60 in the opening 80*a*. Details of the light-emitting device 1 are described with reference to FIGS. 3 to 6.

Figure 3:
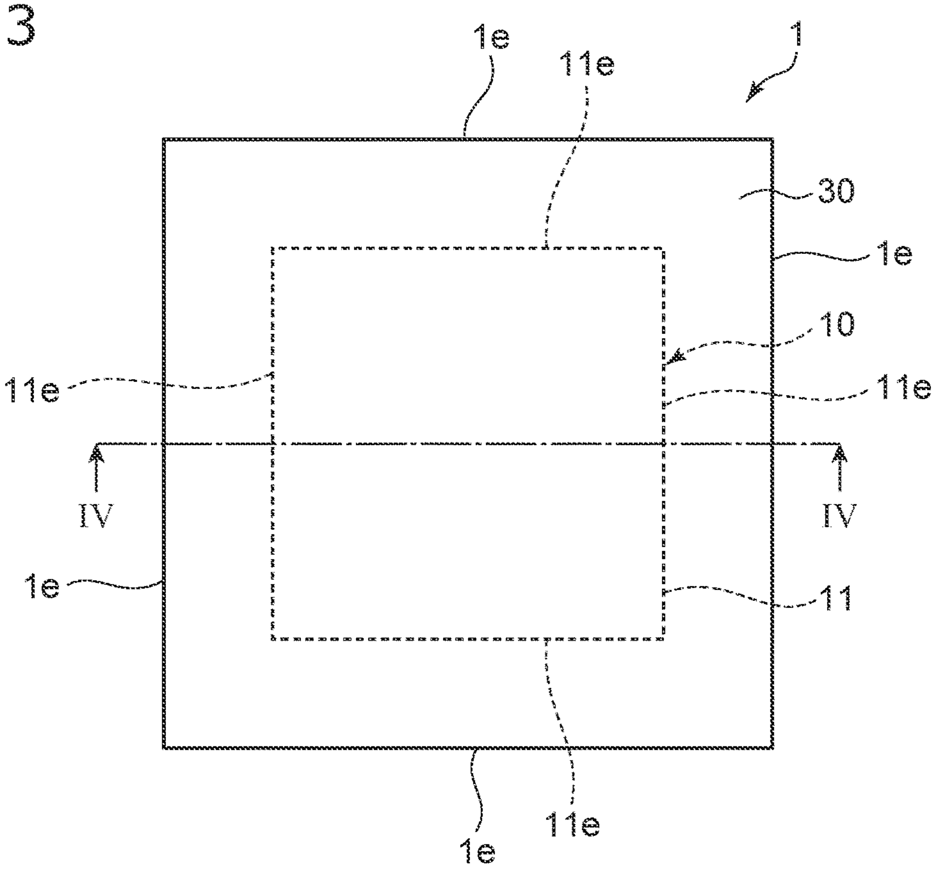
FIG. 3 is a schematic top view of a light-emitting device of an embodiment.

As illustrated in FIG. 3, the light-emitting device 1 has the outer edge 1*e* having a square shape in top view. The length of one side of the outer edge 1*e* of the light-emitting device 1 is in a range from 1.0 mm to 2.0 mm, for example.

Figure 4:
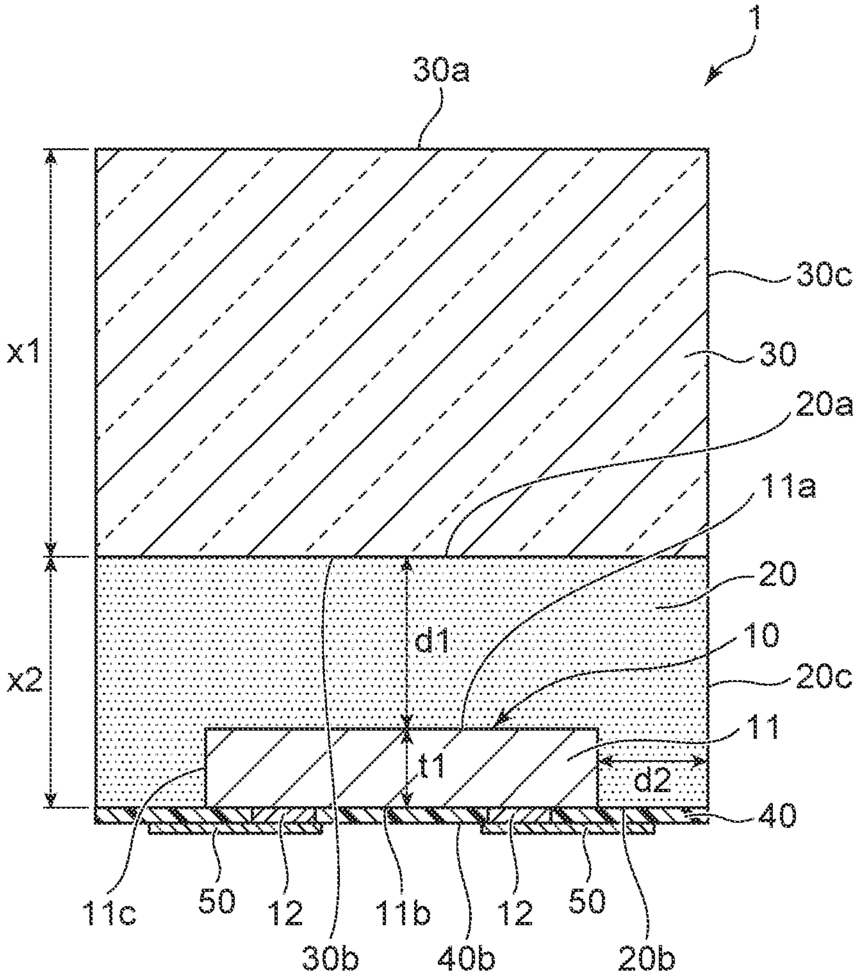
FIG. 4 is a schematic cross-sectional view taken along line IV-IV in FIG. 3.

FIG. 4 is a schematic cross-sectional view taken along line IV-IV in FIG. 3. The light-emitting device 1 includes a light-emitting element 10, a wavelength conversion member 20, a light-transmissive member 30, and a first light reflective member 40.

The light-emitting element 10 is, for example, a light-emitting diode (LED). The light-emitting element 10 includes an element portion 11. As illustrated in FIG. 3, the element portion 11 has an outer edge 11*e* having a square shape in top view. For example, the length of one side of the outer edge 11*e* of the element portion 11 is in a range from 640 μm to 1300 μm. In top view, the outer edge 11*e* of the element portion 11 extends along the outer edge 1*e* of the light-emitting device 1. A thickness t1 of the element portion 11 is in a range from 130 μm to 280 μm, for example. The thickness t1 of the element portion 11 represents the shortest distance between an upper surface 11*a* and a lower surface 11*b* of the element portion 11.

The element portion 11 has a semiconductor structure. The element portion 11 may further include a base of sapphire or the like. The semiconductor structure includes an n-type semiconductor layer, a p-type semiconductor layer, and a light-emitting layer interposed between the n-type semiconductor layer and the p-type semiconductor layer. The light-emitting layer may have a structure such as a double heterojunction or a single quantum well (SQW) structure, or may have a structure with a group of active layers such as a multiple quantum well (MQW) structure. The semiconductor structure emits visible light or ultraviolet light. An example of the semiconductor structure including such a light-emitting layer may include $In_xAl_yG_{1-x-y}N$ ($0 \le x$, $0 \le y$, $x+y \le 1$).

The semiconductor structure may have a structure including one or more light-emitting layers between the n-type semiconductor layer and the p-type semiconductor layer, or may have a structure in which a structure sequentially including the n-type semiconductor layer, the light-emitting layer, and the p-type semiconductor layer is repeated a plurality of times. When the semiconductor structure includes a plurality of light-emitting layers, the semiconductor structure may include light-emitting layers having different emission peak wavelengths, or may include light-emitting layers having the same emission peak wavelength. Note that having the same emission peak wavelength includes a case in which there is a variation of about a few nm. A combination of emission peak wavelengths between the plurality of light-emitting layers can be selected as appropriate. For example, when the semiconductor structure includes two light-emitting layers, the light-emitting layers can be selected from light-emitting layers of combinations of blue light and blue light, green light and green light, red light and red light, ultraviolet light and ultraviolet light, blue light and green light, blue light and red light, and green light and red light. Each of the light-emitting layers may include a plurality of active layers having different emission peak wavelengths or may include a plurality of active layers having the same emission peak wavelength.

As illustrated in FIG. 4, the light-emitting element 10 further includes two electrodes 12 disposed on the lower surface 11*b* of the element portion 11. One of the two electrodes 12 functions as an anode electrode and the other functions as a cathode electrode. The electrode 12 can include, for example, Cu, Ni, Ru, Au, Ag, Pt, Fe, Su, or the like. The electrode 12 is electrically connected to the conductive portion 61 in the exposed portion 60*a* of the substrate 60.

The wavelength conversion member 20 is disposed on the upper surface 11*a* and a lateral surface 11*c* of the element portion 11, and covers the upper surface 11*a* and the lateral surface 11*c* of the element portion 11. Light emitted by the light-emitting layer of the element portion 11 enters the wavelength conversion member 20 from the upper surface 11*a* and the lateral surface 11*c* of the element portion 11. The wavelength conversion member 20 includes a first base material and a phosphor. The phosphor converts the wavelength of light emitted by the light-emitting element 10.

Examples of the phosphor that can be used include an yttrium aluminum garnet based phosphor (for example, $Y_3(Al,Ga)_5O_{12}$:Ce), a lutetium aluminum garnet based phosphor (for example, $Lu_3(Al,Ga)_5O_{12}$:Ce), a terbium aluminum garnet based phosphor (for example, $Tb_3(Al,Ga)_5O_{12}$:Ce), a CCA based phosphor (for example, $Ca_{10}(PO_4)Cl_2$:Eu), an SAE based phosphor (for example, $Sr_4Al_{14}O_{25}$:Eu), a chlorosilicate based phosphor (for example, $Ca_8MgSi_4O_{16}Cl_2$:Eu), a nitride based phosphor such as a β-SiAlON based phosphor (for example, $(Si,Al)_3(O,N)_{16}$:Eu), an α-SiAlON based phosphor (for example, $Ca(Si,Al)_{12}(O,N)_{16}$:Eu), an SLA based phosphor (for example, $SrLiAl_3N_4$:Eu), a CASN based phosphor (for example, $CaAlSiN_3$:Eu), or an SCASN based phosphor (for example, $(Sr,Ca)AlSiN_3$:Eu), a fluoride based phosphor such as a KSF based phosphor (for example, $K_2SiF_6$:Mn), a KSAF based phosphor (for example, $K_2(Si,Al)F_6$:Mn), or an MGF based phosphor (for example, $3.5MgO \cdot 0.5MgF_2 \cdot GeO_2$:Mn), a phosphor having a perovskite structure (for example, $CsPb(F,Cl,Br,I)_3$), and a quantum dot phosphor (for example, CdSe, InP, $AgInS_2$, or $AgInSe_2$).

The first base material of the wavelength conversion member 20 is transmissive to light emitted by the light-emitting element 10. The first base material includes, for example, a resin having good heat resistance, weather resistance, and light resistance. Examples of such a resin include a silicone resin, an epoxy resin, a urea resin, a phenol resin, an acrylic resin, a urethane resin, a fluororesin, and a resin including two or more kinds of these resins.

The light-transmissive member 30 is disposed on an upper surface 20*a* of the wavelength conversion member 20. A lateral surface 20*c* of the wavelength conversion member 20 is exposed from the light-transmissive member 30. The lateral surface 20*c* of the wavelength conversion member 20 and a lateral surface 30*c* of the light-transmissive member 30 are continuous in the same plane.

Light emitted by the light-emitting element 10 and light wavelength-converted by the phosphor are incident on the light-transmissive member 30 from the upper surface 20*a* of the wavelength conversion member 20. The light-transmissive member 30 diffuses light incident from the upper surface 20*a* of the wavelength conversion member 20. The light-transmissive member 30 includes a second base material and a first additive that diffuses light. The first additive is a light-diffusing material.

Examples of the first additive (light-diffusing material) that can be used include silicon oxide, titanium oxide, aluminum oxide, and barium titanate. The light-transmissive member 30 may include a filler for adjusting viscosity in addition to any of these light-diffusing materials.

The second base material is transmissive to light emitted by the light-emitting element 10 and light wavelength-converted by the phosphor. The material of the second base material can be the same material as the material of the first base material of the wavelength conversion member 20, for example. By making a refractive index of the first base material and a refractive index of the second base material substantially the same, refraction and reflection at an interface between the wavelength conversion member 20 and the light-transmissive member 30 can be reduced. Thus, the light distribution characteristics of the light-emitting device 1 can be easily adjusted by the concentration of the phosphor and/or the concentration of the first additive included in the light-transmissive member 30, and desired light distribution characteristics can be easily obtained. The fact that the refractive index of the first base material and the refractive index of the second base material are substantially the same means that the difference between the refractive index of the first base material and the refractive index of the second base material is within 0.3.

The refractive index of the first base material of the wavelength conversion member 20 may be higher than the refractive index of the second base material of the light-transmissive member 30. Alternatively, the refractive index of the first base material of the wavelength conversion member 20 may be lower than the refractive index of the second base material of the light-transmissive member 30. When the refractive index of the first base material is higher than the refractive index of the second base material, the luminous intensity of light emitted from the device-lateral surface of the light-emitting device 1 can be increased more easily as compared with when the refractive index of the first base material is lower than the refractive index of the second base material. When the refractive index of the first base material is lower than the refractive index of the second base material, reflection at an interface between the first base material and the second base material can be easily reduced and the luminous intensity of light emitted from the upper surface of the light-emitting device 1 can be easily increased as compared with when the refractive index of the first base material is higher than the refractive index of the second base material.

Light-emitting surface of the light-emitting device 1 includes an upper surface 30*a* of the light-transmissive member 30, the lateral surface 30*c* of the light-transmissive member 30, and the lateral surface 20*c* of the wavelength conversion member 20. The device-lateral surface of the light-emitting device 1 includes the lateral surface 20*c* of the wavelength conversion member 20 and the lateral surface 30*c* of the light-transmissive member 30.

The first light reflective member 40 is disposed on the lower surface 11*b* of the element portion 11 and a lower surface 20*b* of the wavelength conversion member 20, and covers the lower surface 11*b* of the element portion 11 and the lower surface 20*b* of the wavelength conversion member 20. The first light reflective member 40 has reflectivity with respect to light emitted by the light-emitting element 10 and light wavelength-converted by the phosphor. The first light reflective member 40 allows light directed downward from the light-emitting element 10 and the wavelength conversion member 20 to be reflected toward the light-emitting surface of the light-emitting device 1 above the first light reflective member 40 (the upper surface 30*a* of the light-transmissive member 30, the lateral surface 30*c* of the light-transmissive member 30, and the lateral surface 20*c* of the wavelength conversion member 20). Thus, the amount of light from the light-emitting surface of the light-emitting device 1 can be increased. The device-lateral surface of the light-emitting device 1 further includes a lateral surface of the first light reflective member 40.

The first light reflective member 40 includes a third base material and a second additive. The second light reflective member 80 described above includes a fourth base material and a third additive. The third base material and the fourth base material can use the same material as the material of the first base material. The second additive and the third additive can use the same material as the material of the first additive. A white solder resist can also be used for the second light reflective member 80.

The first light reflective member 40 can cover and protect a lateral surface of the electrode 12. Lower surfaces of the electrode 12 are exposed from the first light reflective member 40.

A thickness of the first light reflective member 40 can be smaller than a thickness x2 of the wavelength conversion member 20 and a thicknesses x1 of the light-transmissive member 30. The thickness of the first light reflective member 40 is, for example, in a range from 0.015 mm to 0.06 mm.

The light-emitting device 1 can further include a metal film 50. The metal film 50 is continuously disposed on the lower surface of the electrode 12 and a lower surface 40*b* of the first light reflective member 40, and is electrically connected to the electrode 12. Two metal films 50 are disposed apart from each other so as to respectively correspond to two electrodes 12 on an anode side and a cathode side. In this example, the metal film 50 is bonded to the conductive portion 61 via a conductive bonding member in the exposed portion side 60*a* of the substrate 60 described above. For example, solder can be used as the conductive bonding member.

Figure 5:
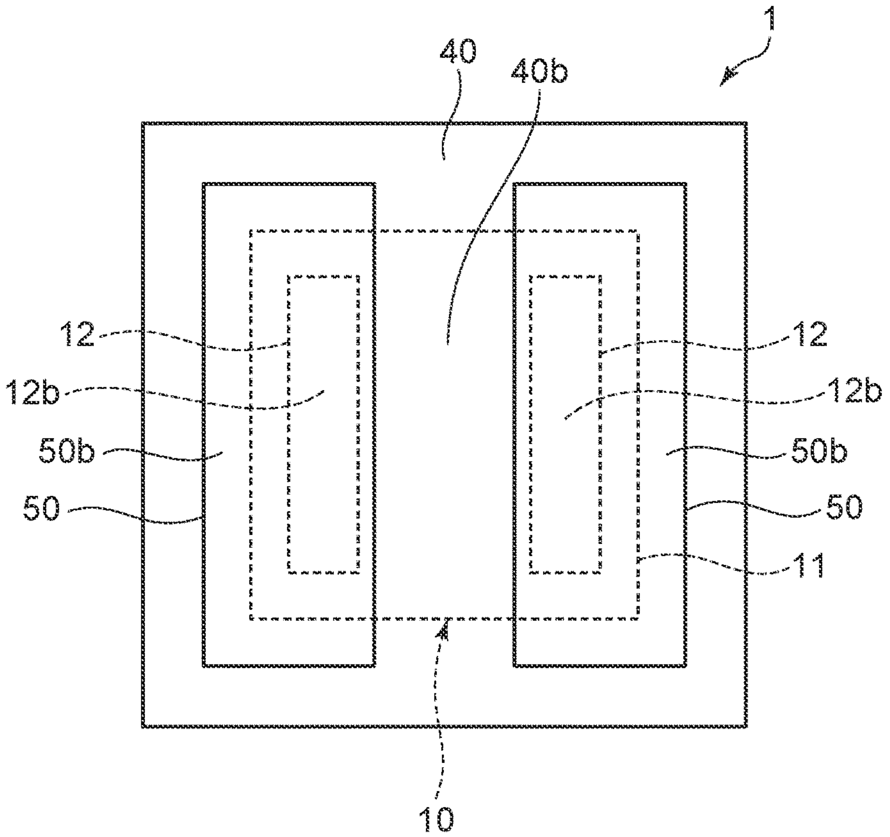
FIG. 5 is a schematic bottom view of a light-emitting device of an embodiment.

As illustrated in FIG. 5, an area of a lower surface 50*b* of the metal film 50 is larger than an area of a lower surface 12*b* of the electrode 12. Thus, a bonding area between the light-emitting device 1 and the substrate 60 can be increased, and the reliability can be improved. The metal film 50 can include, for example, Cu, Ni, Ru, Au, Ag, Pt, Fe, Su, or the like.

The thickness x1 of the light-transmissive member 30 is larger than the thickness x2 of the wavelength conversion member 20. The thickness x1 of the light-transmissive member 30 represents the shortest distance between the upper surface 30*a* and a lower surface 30*b* of the light-transmissive member 30. The thickness x2 of the wavelength conversion member 20 represents the shortest distance between the upper surface 20*a* and the lower surface 20*b* of the wavelength conversion member 20. The thickness x1 of the light-transmissive member 30 is, for example, in a range from 0.63 mm to 1.460 mm. The thickness x2 of the wavelength conversion member 20 is, for example, in a range from 0.36 mm to 0.91 mm.

The ratio of the thickness x1 of the light-transmissive member 30 to the thickness x2 of the wavelength conversion member 20 (x1/x2) is, for example, in a range from 1.1 to 2.0.

Figure 11:
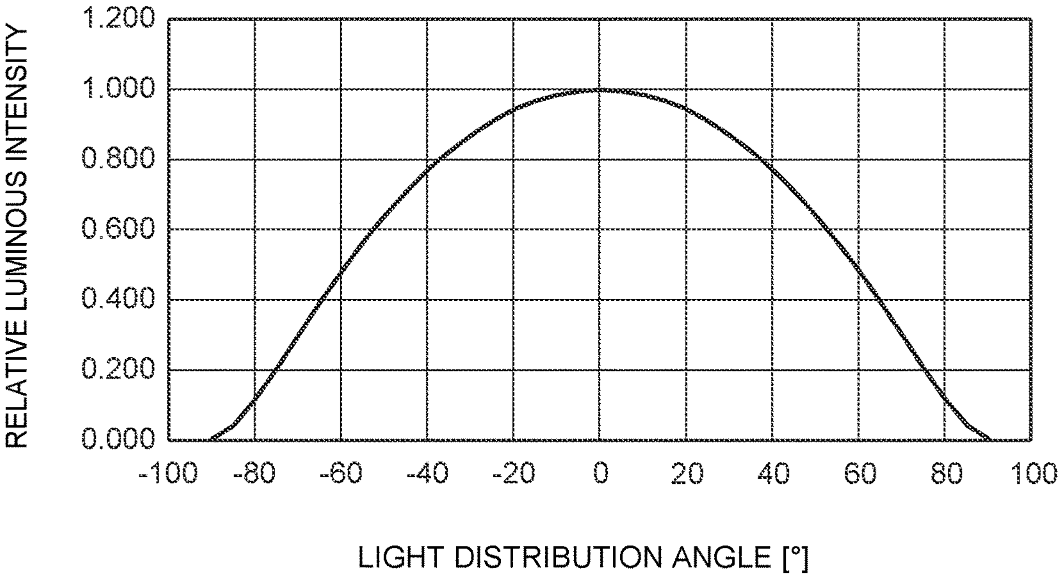
FIG. 11 is a Lambertian light distribution characteristic graph.

By making the thickness x1 of the light-transmissive member 30 disposed on the upper surface 20*a* of the wavelength conversion member 20 larger than the thickness x2 of the wavelength conversion member 20, the light distribution characteristics of the light-emitting device 1 can be made wider than the Lambertian light distribution characteristics shown in FIG. 11. In the present specification, the wide light distribution represents a light distribution characteristic of having a luminous intensity peak in a range between a light distribution angle of 0° and ±90°, the luminous intensity peak being higher than the luminous intensity at the light distribution angle of 0°.

By using the planar light source 100 including the light-emitting device 1 having such light distribution characteristics in, for example, a lighting fixture, luminance unevenness on a light-emitting surface of the lighting fixture can be reduced even when the distance from the light-emitting device 1 to the light-emitting surface of the lighting fixture is short as a result of a reduction in the thickness of the lighting fixture. Furthermore, a person viewing the light-emitting surface of the lighting fixture can be less likely to feel that the light-emitting device 1 is too bright at certain points. As a result, the thickness of the lighting fixture including the planar light source 100 can be reduced and the weight of the lighting fixture can be reduced as the lighting fixture is made thinner. The lighting fixture may include the planar light source 100 and a light-transmissive cover disposed on a light-emitting surface side of the planar light source 100.

Figure 6:
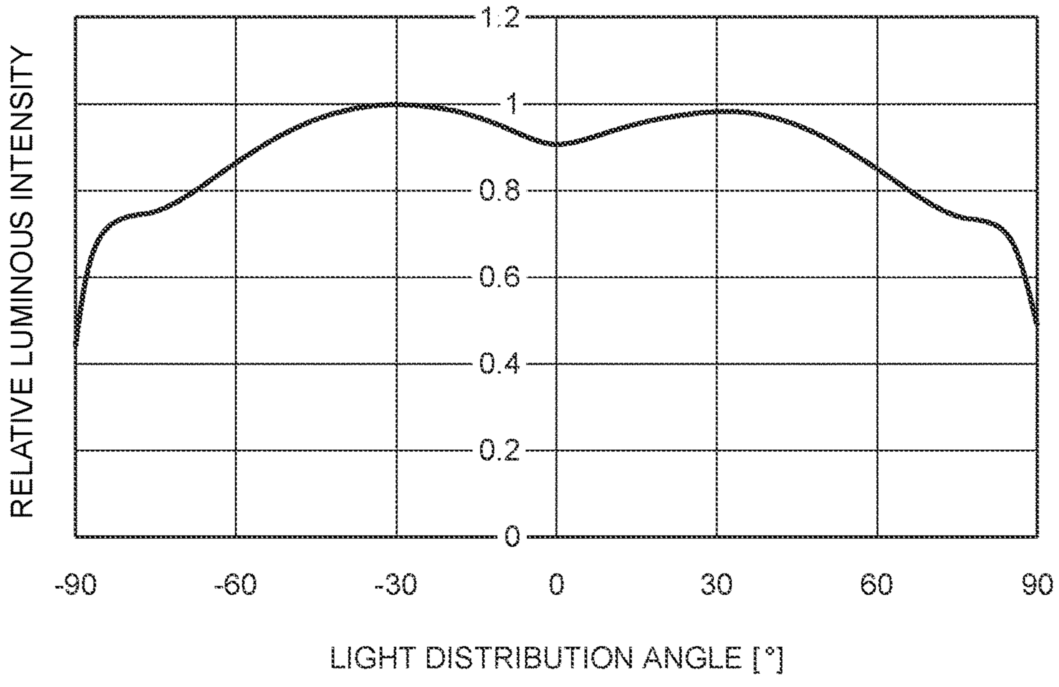
FIG. 6 is a light distribution characteristic graph of a light-emitting device of an embodiment.
Figure 10:
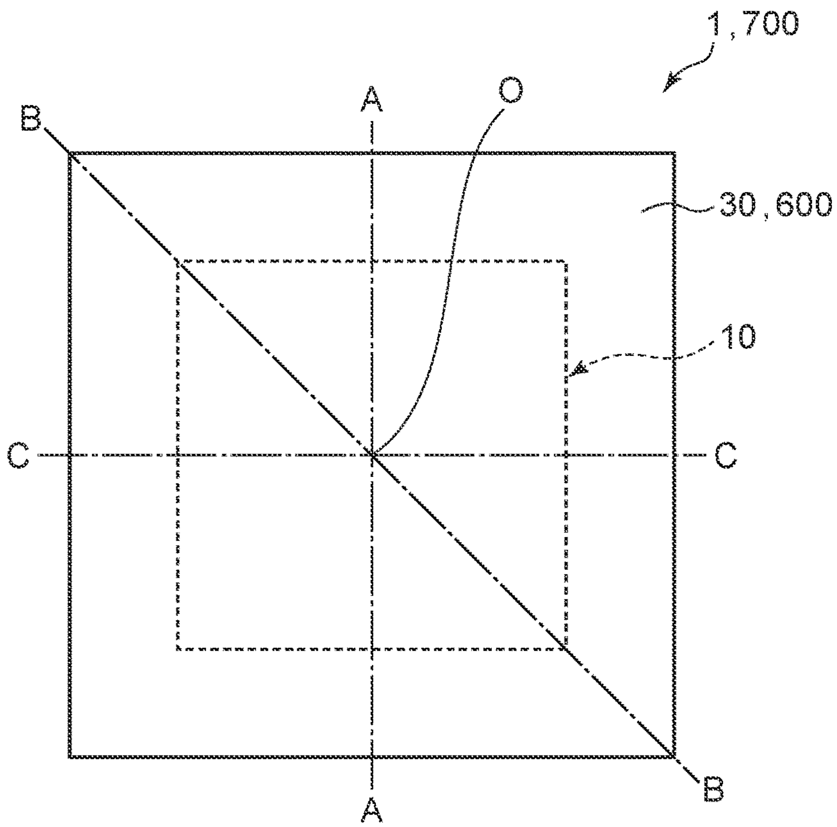
FIG. 10 is a schematic top view of a light-emitting device of an embodiment as well as a light-emitting device of a comparative example.

FIG. 6 is a graph showing an example of light distribution characteristics when one light-emitting device 1 emits light. The light distribution characteristics shown in FIG. 6 are satisfied in a cross section along at least one arbitrary straight line passing through a center O in the top view of the light-emitting device 1 illustrated in FIG. 10, preferably along any straight line. The light-emitting device 1 has light distribution characteristics (so-called batwing light distribution characteristics) of having a first luminous intensity peak higher than the luminous intensity at the light distribution angle of 0°, in a range of a light distribution angle of 0° to −90° (excluding 0° and −90°), and a second luminous intensity peak higher than the luminous intensity at the light distribution angle of 0°, in a range of a light distribution angle of 0° to 90° (excluding 0° and 90°). The light-emitting device 1 preferably has the first luminous intensity peak in a range of a light distribution angle of 20° to 50°, and has the second luminous intensity peak in a range of a light distribution angle of −20° to −50°.

Figure 9:
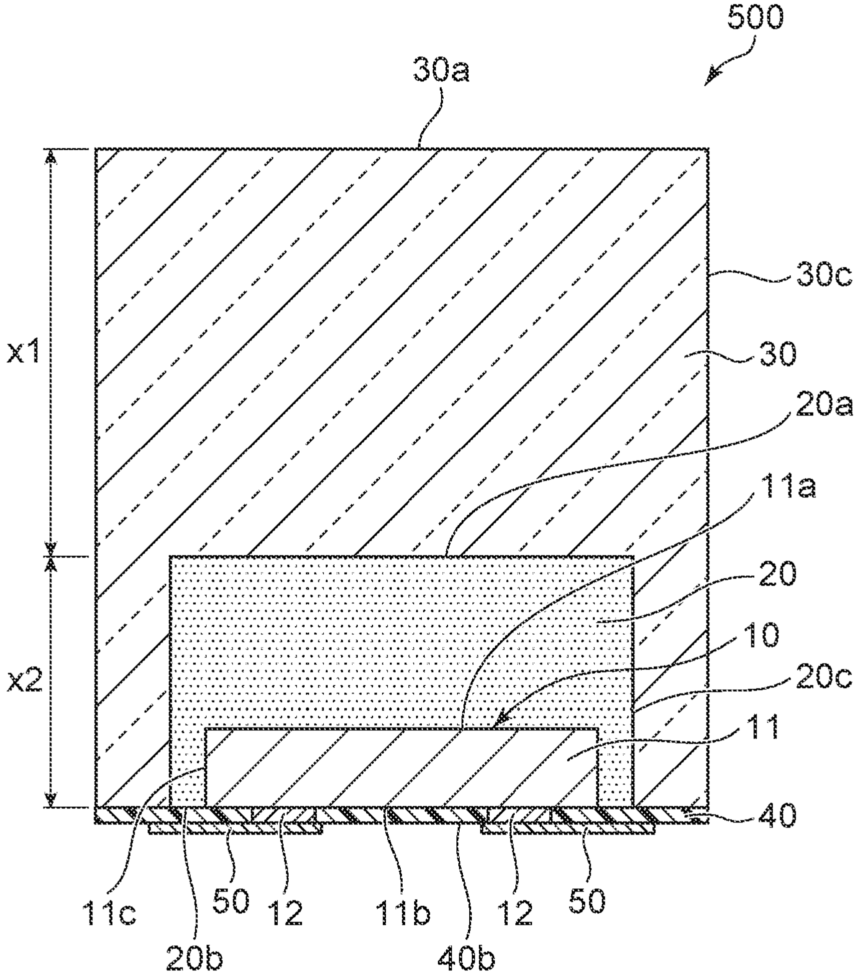
FIG. 9 is a schematic cross-sectional view illustrating a light-emitting device of another embodiment.

As illustrated in FIG. 9, a light-emitting device 500 including a light-emitting element 10, a wavelength conversion member 20 covering an upper surface and a lateral surface of the light-emitting element 10, and a light-transmissive member 30 covering an upper surface and a lateral surface of the wavelength conversion member 20 is conceivable as another embodiment of the configuration for achieving wide light distribution characteristics of the light-emitting device. In comparison between the light-emitting device 1 of the embodiment and the light-emitting device 500 of another embodiment, the light-emitting device 1 of the embodiment can have an improved luminous flux while achieving wide light distribution characteristics because a lateral surface 20*c* of the wavelength conversion member 20 is exposed from the light-transmissive member 30. When the light-emitting device 1 of the embodiment and the light-emitting device 500 of the other embodiment have the same outer size, a distance between a lateral surface 11*c* of an element portion 11 of the light-emitting element 10 and the lateral surface 20*c* of the wavelength conversion member 20 is short and thus the degree of margin of the positional deviation of the light-emitting element 10 with respect to the wavelength conversion member 20 is reduced in the light-emitting device 500 of the other embodiment in which the light-transmissive member 30 covers the lateral surface of the wavelength conversion member 20 as compared with the light-emitting device 1 of the embodiment. In contrast, in the light-emitting device 1 of the embodiment in which the lateral surface 20*c* of the wavelength conversion member 20 is exposed from the light-transmissive member 30, a distance d2 between the lateral surface 11*c* of the element portion 11 and the lateral surface 20*c* of the wavelength conversion member 20 can be made long and the positional deviation of the light-emitting element 10 with respect to the wavelength conversion member 20 can be reduced as compared with the light-emitting device 500 of the other embodiment. Thus, in the light-emitting device 1 of the embodiment, the deviation of the light distribution chromaticity of the light-emitting device 1 due to the positional deviation of the light-emitting element 10 can be reduced.

The light distribution chromaticity is described below. "Light distribution" and "light distribution characteristics," which are widely used in general, represent a luminous intensity distribution in each direction from a light source and characteristics thereof. On the other hand, the "light distribution chromaticity" and the "light distribution chromaticity characteristics" respectively refer to the chromaticity distribution in each direction from the light source and characteristics thereof. In recent years, light-emitting devices used for lighting applications and planar light sources each including a plurality of light-emitting devices are required to have desired light distribution characteristics. However, simply having the desired light distribution characteristics does not consider chromaticity unevenness or chromaticity deviation, and in order to obtain a higher-quality light-emitting device or planar light source in which chromaticity unevenness and chromaticity deviation are reduced, the light distribution chromaticity also needs to be considered.

The total area of four lateral surfaces 30*c* of the light-transmissive member 30 and four lateral surfaces 20*c* of the wavelength conversion member 20 can be made larger than the area of the top surface 30*a* of the light-transmissive member 30. Thus, the amount of light emitted from all lateral surfaces of the light-emitting device 1 can be made larger than the amount of light emitted from the upper surface thereof, so that the light distribution characteristics of the light-emitting device 1 can be easily made to be a wide light distribution.

Preferably, $y=1.02+(-2.59\times10^{-5}\times x\mathbf{1})+(-1.95\times10^{-5}\times x\mathbf{2})+(-0.00400\times x\mathbf{3})$ . . . (1) satisfies a range from 0.99 to 1.01. y is an objective variable in a multiple regression equation in which the thickness x1 of the light-transmissive member 30, the thickness x2 of the wavelength conversion member 20, and an area x3 of the exposed portion 60*a* on the upper surface of the substrate 60 are explanatory variables, and represents an unevenness value.

The unevenness value represents the ratio of the luminance of the region between the light-emitting devices to the luminance of the region immediately above the light-emitting device 1 in the planar light source 100. The luminance of the region between the light-emitting devices represents the luminance at the center of a region between four light-emitting devices 1 extracted from the plurality of light-emitting devices 1 disposed on the substrate 60 at equal intervals in a first direction X and a second direction Y orthogonal to each other as illustrated in FIG. 1. When the luminance of the region immediately above the light-emitting device 1 is the same as the luminance of the region between the light-emitting devices, the unevenness value is 1. As the unevenness value is closer to 1, the difference between the luminance of the region immediately above the light-emitting device 1 and the luminance of the region between the light-emitting devices is smaller. The unevenness value correlates with the light distribution characteristics of the light-emitting device 1. When the light distribution characteristics of the light-emitting device 1 become wider, the difference between the luminance of the region immediately above the light-emitting device 1 and the luminance of the region between the light-emitting devices tends to become smaller. As the unevenness value is closer to 1, the luminance unevenness on the light-emitting surface of the planar light source 100 is smaller.

Equation (1) above was obtained by multiple regression analysis from the explanatory variables x1, x2, and x3 of 28 models and the measured values of the unevenness value shown in FIG. 7. The coefficients in equation (1) above are partial regression coefficients. In the multiple regression analysis, the degree of influence on the unevenness value was verified using explanatory variables other than x1, x2, and x3, which are considered to have an influence on the unevenness value. A factor having a low p-value representing a significant probability of a coefficient of an explanatory variable was extracted by a stepwise method. As a result, the thickness x1 of the light-transmissive member 30, the thickness x2 of the wavelength conversion member 20, and the area x3 of the exposed portion 60*a* in the upper surface of the substrate 60 were calculated in descending order of the p-value. That is, it was concluded that the thickness x1 of the light-transmissive member 30, the thickness x2 of the wavelength conversion member 20, and the area x3 of the exposed portion 60*a* in the upper surface of the substrate 60 can be used as explanatory variables having a high correlation with the unevenness value.

Figure 8:
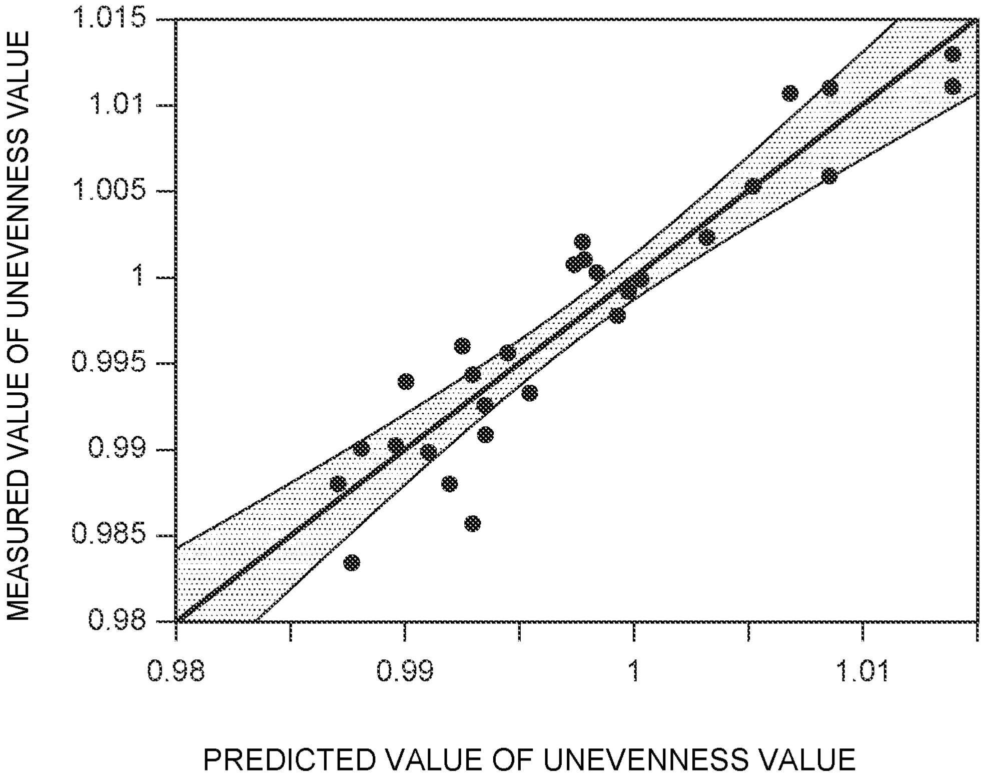
FIG. 8 is a scatter graph showing a relationship between a predicted value and a measured value of an unevenness value.

FIG. 8 is a scatter graph in which predicted values and measured values of the unevenness value shown in FIG. 7 are plotted. The horizontal axis represents the predicted values of the unevenness value, and the vertical axis represents the measured values of the unevenness value. The measured values of the unevenness value are values obtained by simulation. The predicted values of the unevenness value are values obtained by Equation (1) above. In this scatter graph, a thick solid line indicates a straight line on which the predicted values and the measured values of the unevenness value coincide with each other.

The result of FIG. 8 indicates that the unevenness value can be predicted with sufficient accuracy with respect to the measured values from Equation (1) above. Consequently, by adjusting the thickness x1 of the light-transmissive member 30, the thickness x2 of the wavelength conversion member 20, and the area x3 of the exposed portion 60*a* in the upper surface of the substrate 60 such that Equation (1) above satisfies a range from 0.99 to 1.01, the light distribution characteristics of the light-emitting device 1 can be widened, so that the difference between the luminance of the region immediately above the light-emitting device 1 and the luminance of the region between the light-emitting devices can be easily reduced. That is, luminance unevenness on the light-emitting surface of the planar light source 100 can be reduced.

A distance d1 between the upper surface 11*a* of the element portion 11 and the upper surface 20*a* of the wavelength conversion member 20 can be made longer than the distance d2 between the lateral surface 11*c* of the element portion 11 and the lateral surface 20*c* of the wavelength conversion member 20. The distance d1 represents the shortest distance between the upper surface 11*a* of the element portion 11 and the upper surface 20*a* of the wavelength conversion member 20. The distance d2 represents the shortest distance between the lateral surface 11*c* of the element portion 11 and the lateral surface 20*c* of the wavelength conversion member 20. The distance d1 is, for example, in a range from 220 μm to 640 μm. The thickness d2 is, for example, in a range from 170 μm to 360 μm. Light emitted from the element portion 11 includes immediately upper light components emitted from the upper surface 11*a* and lateral surface light components emitted from the lateral surface 11*c*. Because the amount of the immediately upper light components is larger than the amount of the lateral surface light components, the distance d1 is set to larger than the distance d2, so that variations in chromatic light distribution characteristics between a region immediately above the light-emitting device 1 and a region lateral to the light-emitting device 1 can be easily reduced.

The ratio of the total thickness of the light-emitting device 1 to one side of the outer edge 1*e* thereof can be set in a range from 1.01 to 1.24. The total thickness of the light-emitting device 1 is the sum of the thickness x1 of the light-transmissive member 30, the thickness x2 of the wavelength conversion member 20, and the thickness of the light reflective member 40. When the light-emitting device 1 includes the metal film 50, the total thickness of the light-emitting device 1 is the sum of the thickness x1 of the light-transmissive member 30, the thickness x2 of the wavelength conversion member 20, the thickness of the light reflective member 40, and the thickness of the metal film 50.

The above distance d1 may be larger than the thickness t1 of the element portion 11. The distance d1 may also be equal to or smaller than the thickness t1 of the element portion 11. Also in this case, d1 is set to larger than d2, so that variations in chromatic light distribution characteristics between the region immediately above the light-emitting device 1 and the region lateral to the light-emitting device 1 can be easily reduced.

Figure 12:
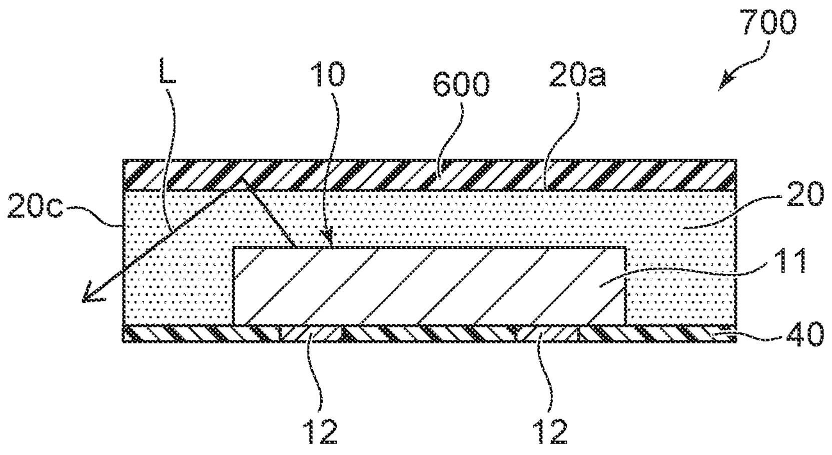
FIG. 12 is a schematic cross-sectional view of a light-emitting device of a comparative example.

An example of a light-emitting device that can achieve a light distribution wider than the Lambertian light distribution characteristic is a light-emitting device 700 of a comparative example illustrated in FIG. 12. The light-emitting device 700 of the comparative example includes the same members (the light-emitting element 10, the wavelength conversion member 20, and the light reflective member 40) as the light-emitting device 1 of the embodiment, and a light adjustment member 600 disposed on the upper surface 20*a* of the wavelength conversion member 20. The light adjustment member 600 includes a light-transmissive resin and a light diffusing material, and substantially blocks upwardly traveling light from the element portion 11. The thickness of the light adjustment member 600 is smaller than the thickness of the wavelength conversion member 20 (the shortest distance between the upper surface of the light reflective member 40 and the upper surface of the wavelength conversion member 20).

Results of measuring light distribution characteristics and light distribution chromaticity characteristics for each of the light-emitting device 1 of the embodiment and the light-emitting device 700 of the comparative example are described below with reference to FIGS. 13A to 15B. In FIGS. 13A to 15B, each solid line indicates the light distribution characteristics or the light distribution chromaticity characteristics in a cross section taken along line A-A illustrated in FIG. 10, each broken line indicates the light distribution characteristics or the light distribution chromaticity characteristics in a cross section taken along line B-B illustrated in FIG. 10, and each one dot chain line indicates the light distribution characteristics or the light distribution chromaticity characteristics in a cross section taken along line C-C illustrated in FIG. 10.

Figure 13A:
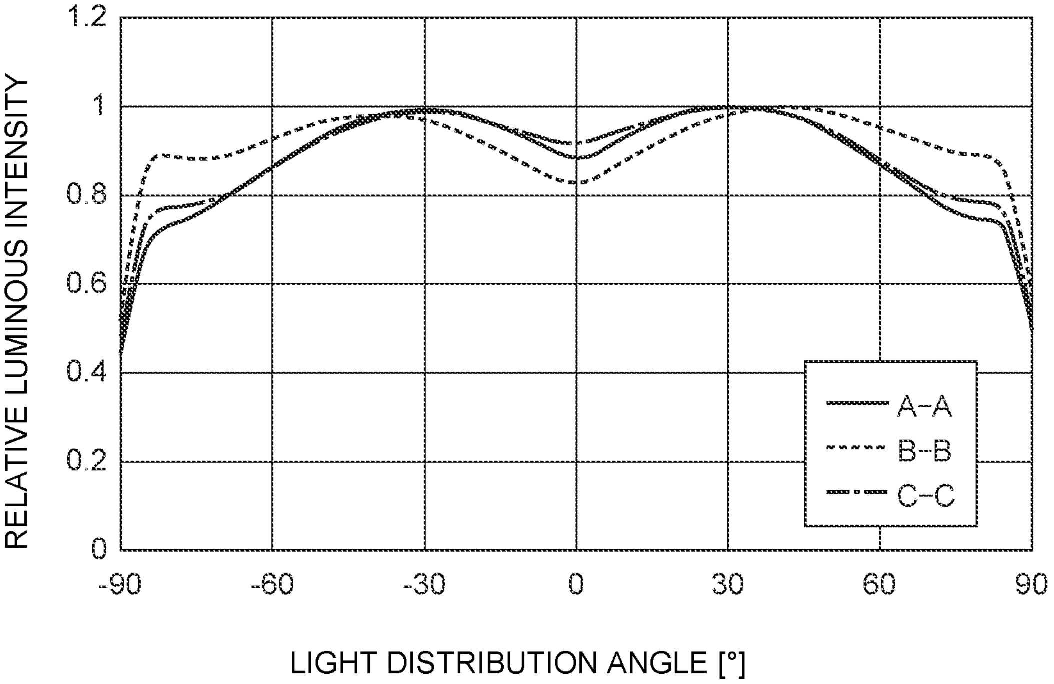
FIG. 13A is a light distribution characteristic graph of a light-emitting device of an embodiment.
Figure 13B:
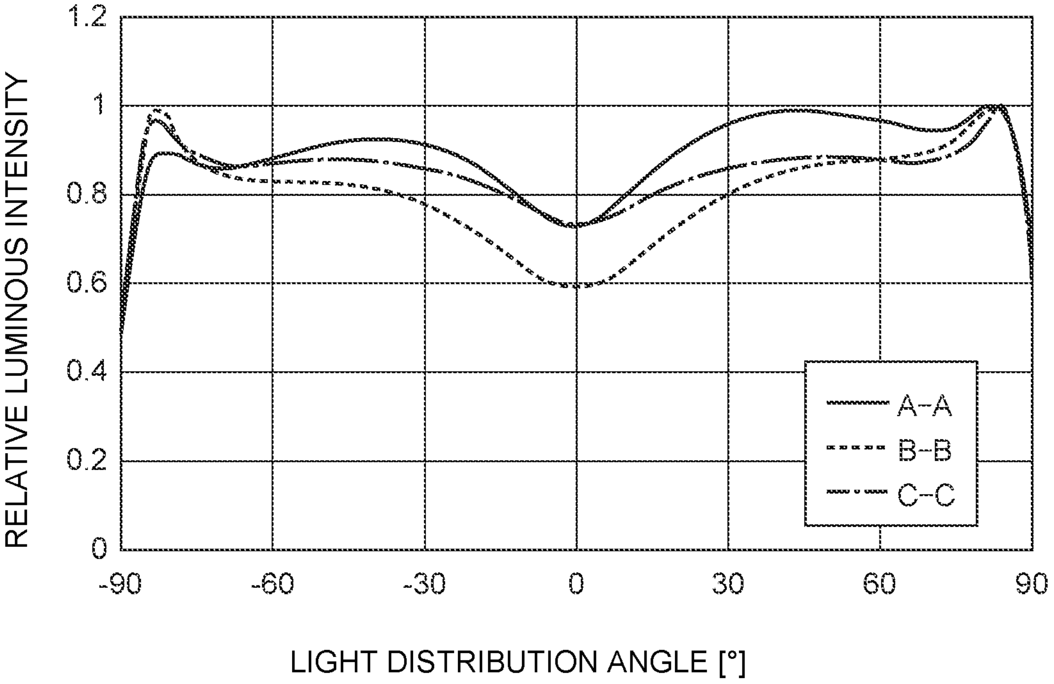
FIG. 13B is a light distribution characteristic graph of a light-emitting device of a comparative example.

FIG. 13A shows the light distribution characteristics of the light-emitting device 1 of the embodiment. FIG. 13B shows the light distribution characteristics of the light-emitting device 700 of the comparative example. In order to obtain a batwing light distribution in the light-emitting device 700, the concentration and the like of the light-diffusing material included in the light adjustment member 600 are adjusted to substantially block upward light from the element portion 11. The concentration of the light-diffusing material included in the light adjustment member 600 in the light-emitting device 700 of the comparative example is significantly higher than the concentration of the light-diffusing material included in the light-transmissive member 30 in the light-emitting device 1 of the embodiment. In the light-emitting device 700 of the comparative example configured as described above, the amount of light L that is emitted by the light-emitting element 10 and reflected by the light adjustment member 600 to return into the wavelength conversion member 20, which is return light, is increased. The return light L can pass through the wavelength conversion member 20 again and be extracted from the lateral surface 20*c* of the wavelength conversion member 20 to the outside of the light-emitting device 700. When the distance that the return light L travels in the wavelength conversion member 20 is increased, the amount of light subjected to wavelength conversion out of the light emitted by the light-emitting element 10 is increased, and chromaticity unevenness may occur.

Figure 14A:
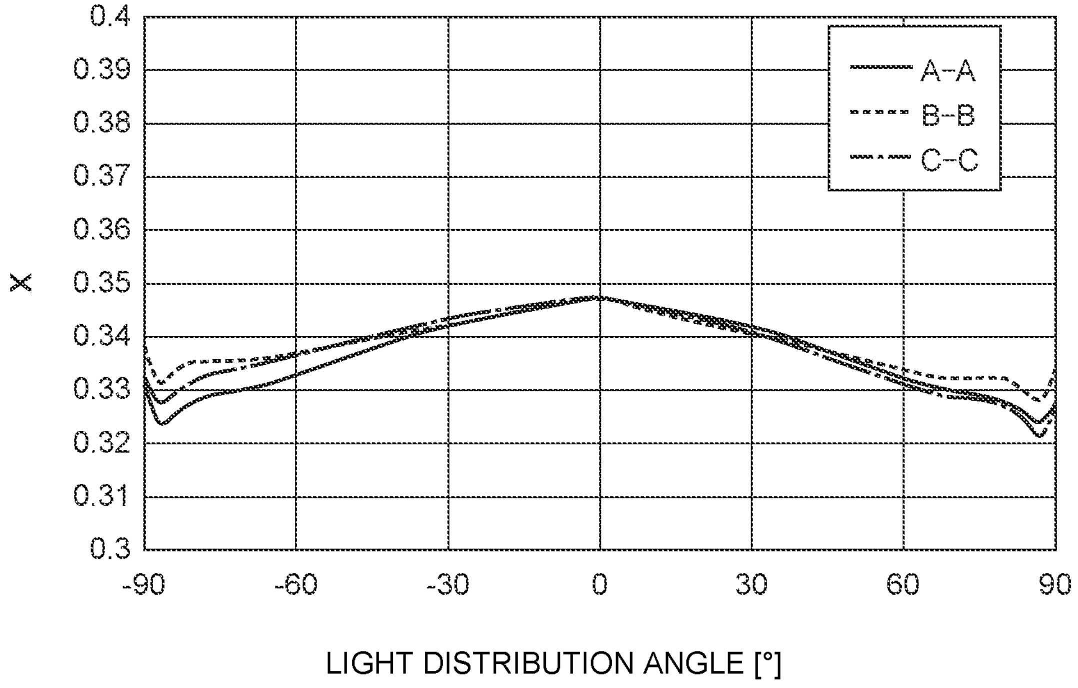
FIG. 14A is a light distribution chromaticity characteristic graph at an x coordinate of a light-emitting device of an embodiment.
Figure 14B:
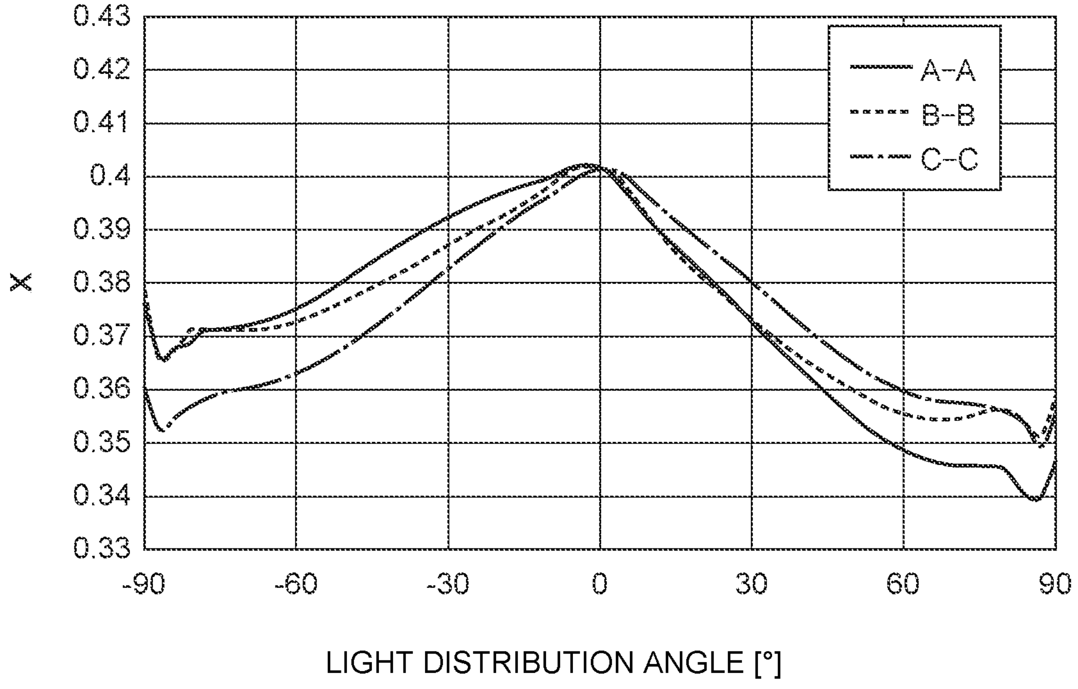
FIG. 14B is a light distribution chromaticity characteristic graph at an x coordinate of a light-emitting device of a comparative example.
Figure 15A:
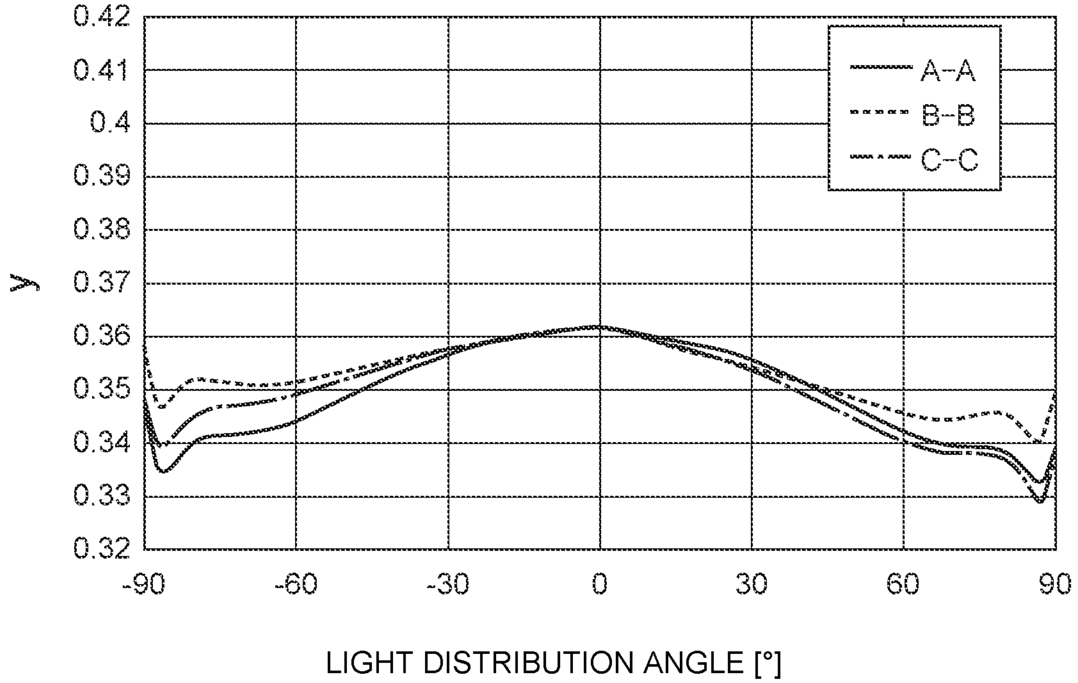
FIG. 15A is a light distribution chromaticity characteristic graph at a y coordinate of a light-emitting device of an embodiment.
Figure 15B:
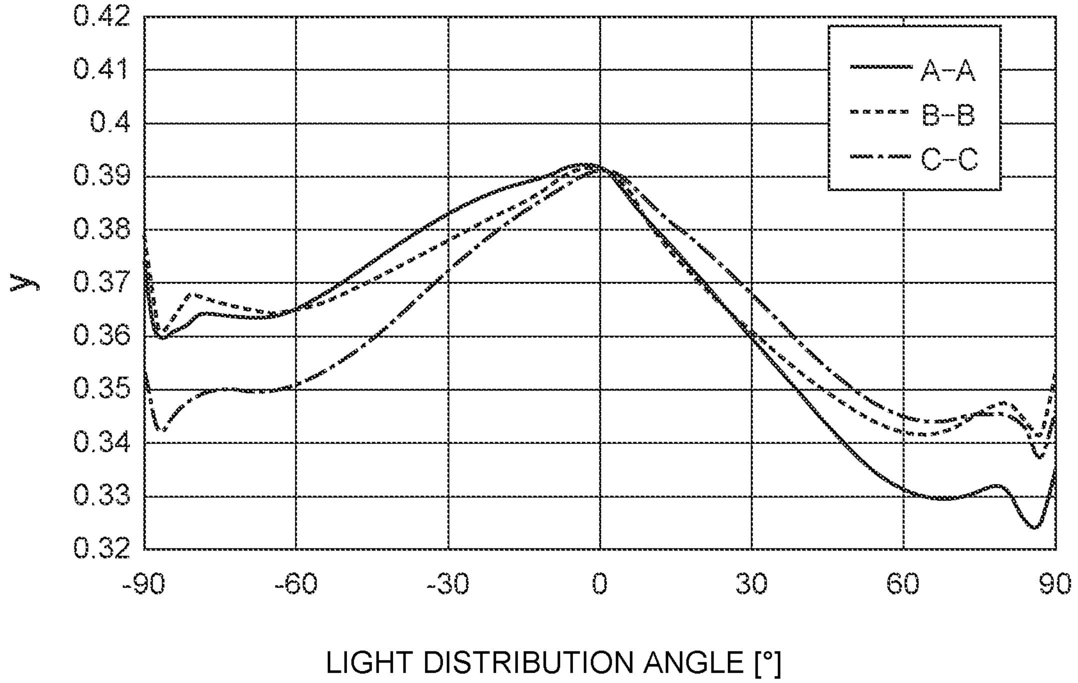
FIG. 15B is a light distribution chromaticity characteristic graph at a y coordinate of a light-emitting device of a comparative example.

FIGS. 14A and 15A show the light distribution chromaticity characteristics of the light-emitting device 1 of the embodiment. FIGS. 14B and 15B show the light distribution chromaticity characteristics of the light-emitting device 700 of the comparative example.

FIGS. 14A and 14B show light distribution chromaticity characteristics at an x coordinate in CIE chromaticity. FIGS. 15A and 15B show light distribution chromaticity characteristics at a y coordinate in the CIE chromaticity. In the light distribution chromaticity characteristics (FIGS. 14B and 15B) of the light-emitting device 700 of the comparative example, the rate of change in chromaticity with respect to a difference in light distribution angle is larger and the color unevenness is larger than in the light distribution chromaticity characteristics (FIGS. 14A and 15A) of the light-emitting device 1 of the embodiment.

That is, in the light-emitting device 700 of the comparative example, even though the light distribution characteristics (FIG. 13B) are set to the batwing light distribution characteristics, the chromaticity unevenness is larger than the chromaticity unevenness in the light-emitting device 1 of the embodiment due to the influence of the return light L described above.

According to the light-emitting device 1 and the planar light source 100 of the embodiment, both luminance unevenness and chromaticity unevenness can be reduced.

Examples of the material of the second base material of the light-transmissive member 30 include a silicone resin such as a phenyl silicone resin. In this case, the light-diffusing material included in the light-transmissive member 30 is preferably a light-diffusing material, such as silicon oxide, having a small refractive index difference from a phenyl silicone resin. For example, when titanium oxide is used as the light-diffusing material, the return light increases because the refractive index is large. To avoid this, the refractive index difference is preferably maintained at a certain level or lower. Examples of the light-diffusing material include silicon oxide and aluminum oxide. Of silicon oxide and aluminum oxide, silicon oxide, which has a smaller refractive index difference from the phenyl silicone resin, is preferable. By reducing the refractive index difference between the second base material and the light-diffusing material in the light-transmissive member 30, return light that is reflected at an interface between the second base material and the light-diffusing material and returns into the wavelength conversion member 20 can be reduced.

The concentration of the light-diffusing material in the light-transmissive member 30 is preferably in a range from 13 wt % to 40 wt %. Thus, a value close to 1 is obtained as the unevenness value described above, and the difference between the luminance of the region immediately above the light-emitting device 1 and the luminance of the region between the light-emitting devices is likely to be small.

As illustrated in FIG. 1, a plurality of light-emitting devices 1 each having a square shape in top view and a plurality of openings 80*a* each having a square shape in top view can be arranged side by side in the first direction X and the second direction Y at regular intervals.

Modified examples of the planar light source of the embodiment are described below with reference to FIGS. 16 to 20.

Figure 16:
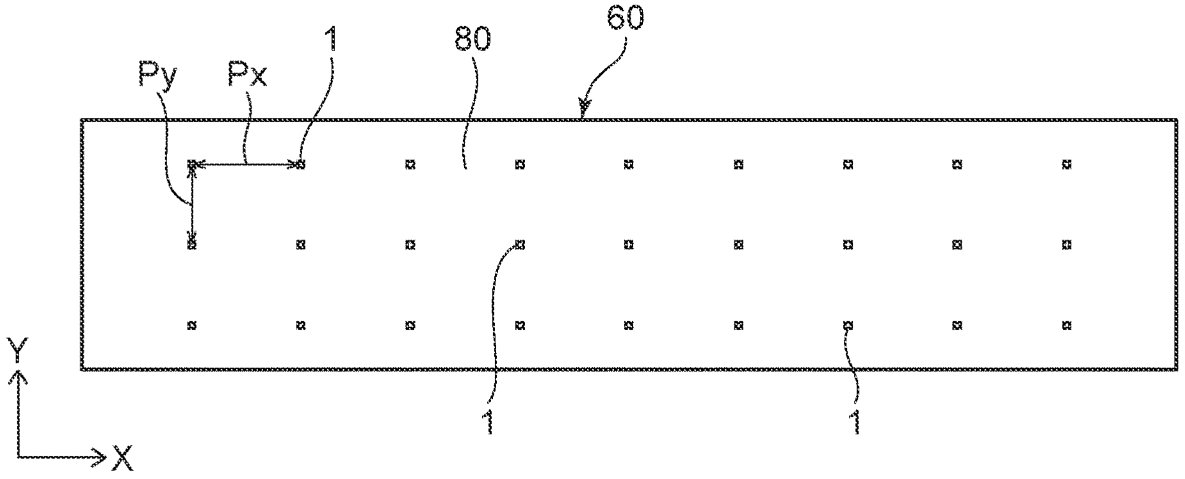
FIG. 16 is a schematic top view of a planar light source according to a first modified example of an embodiment.

According to the planar light source illustrated in FIG. 16, the shape of the substrate 60 in top view is rectangular. In top view, an outer edge of the substrate 60 extending in the first direction X is longer than an outer edge thereof extending in the second direction Y. A plurality of light-emitting devices 1 are arranged in the first direction X and the second direction Y and are disposed on the upper surface of the substrate 60. Assuming that the first direction X is a row direction and the second direction Y is a column direction, the plurality of light-emitting devices 1 are disposed in a plurality of rows×a plurality of columns (3 rows×9 columns in the example illustrated in FIG. 16). The plurality of light-emitting devices 1 may be disposed in one row× a plurality of columns. A first distance Px between two light-emitting devices 1 adjacent to each other in the first direction X may be different from a second distance Py between two light-emitting devices 1 adjacent to each other in the second direction Y, and as illustrated in FIG. 16, the first distance Px may be longer than the second distance Py. In this case, the luminance of a region between two light-emitting devices 1 adjacent to each other in the first direction X is likely to be lower than the luminance of a region between two light-emitting devices 1 adjacent to each other in the second direction Y.

Figure 17:
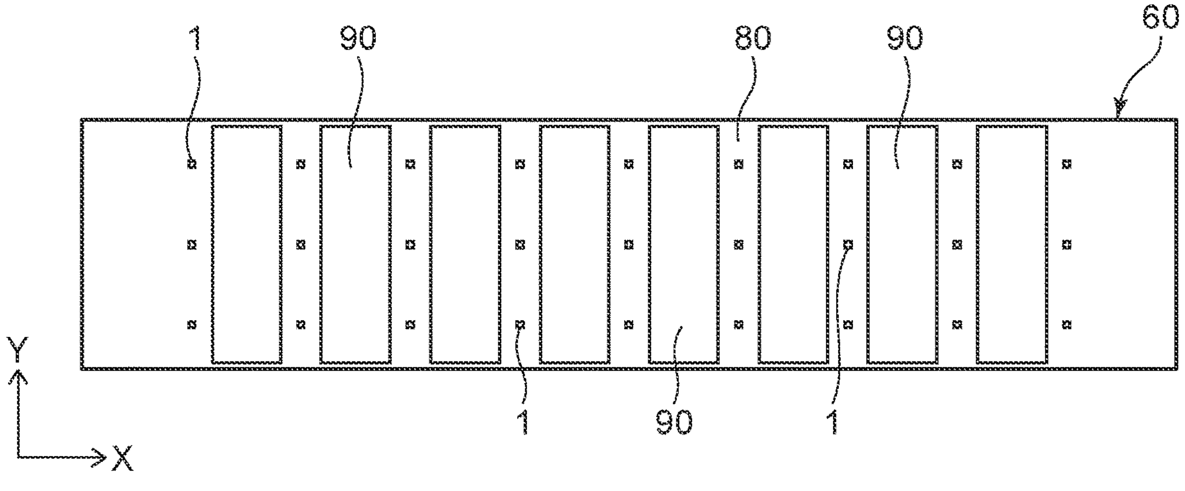
FIG. 17 is a schematic top view of a planar light source according to a second modified example of an embodiment.

Therefore, as illustrated in FIG. 17, a third light reflective member 90 may be disposed on the second light reflective member 80 in a region between two light-emitting devices 1 adjacent to each other in the first direction X. That is, the reflectance of a region provided with the third light reflective member 90 is made higher than the reflectance of a region where the second light reflective member 80 is disposed but the third light reflective member 90 is not disposed. This can reduce the difference between the luminance of the region between two light-emitting devices 1 adjacent to each other in the first direction X and the luminance of a region between two light-emitting devices 1 adjacent to each other in the second direction Y, thereby reducing luminance unevenness on a light-emitting surface of the planar light source. As a material of the third light reflective member 90, for example, the same material as the material of the second light reflective member 80 can be used.

Figure 18:
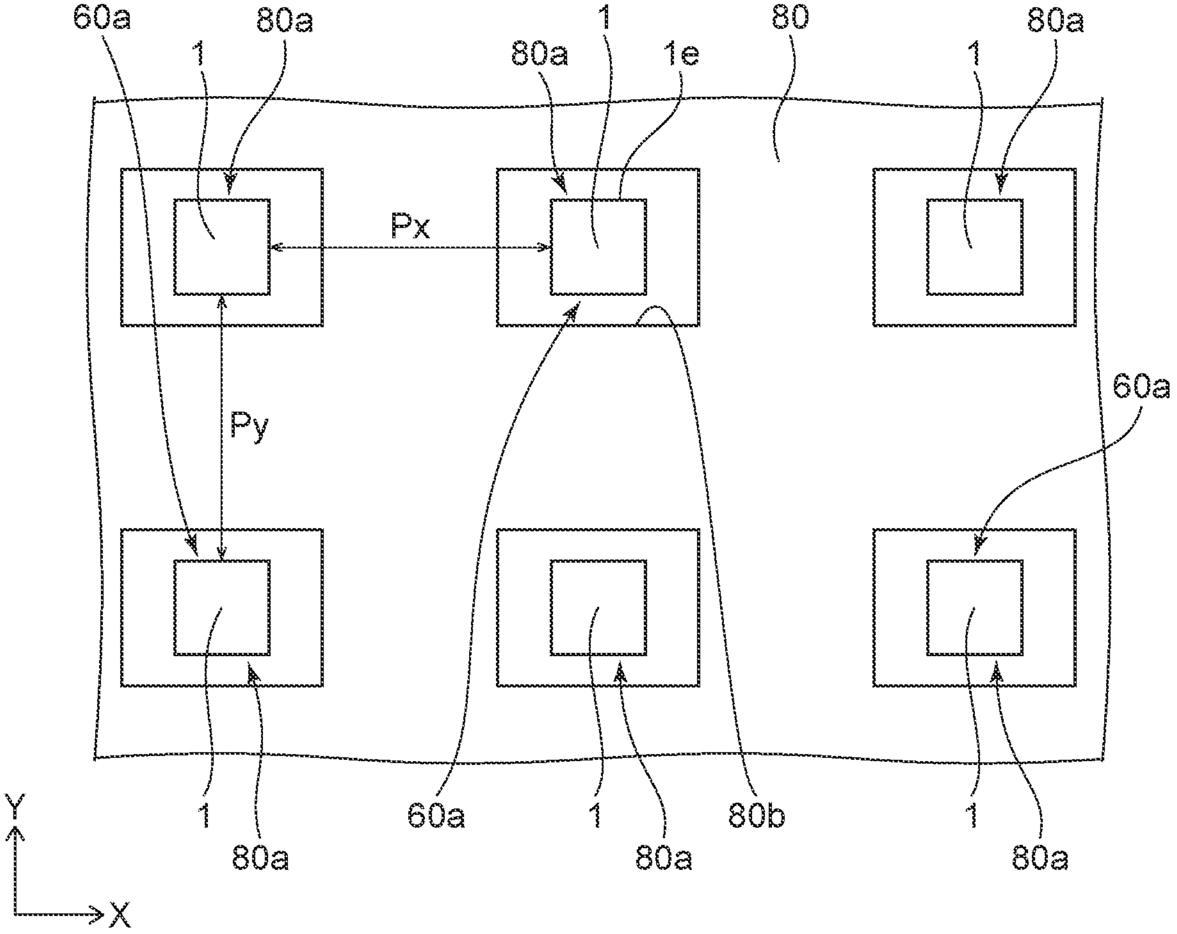
FIG. 18 is a schematic top view of a planar light source according to a third modified example of an embodiment.

As illustrated in FIG. 18, the width of the opening 80*a* in the first direction X may be made larger than the width of the opening 80*a* in the second direction Y in top view. Thus, in top view, the width of the exposed portion 60*a* in the first direction X between the outer edge 1*e* of the light-emitting device 1 and the inner edge 80*b* of the second light reflective member 80 defining the opening 80*a* can be made larger than the width of the exposed portion 60*a* in the second direction Y between the outer edge 1*e* of the light-emitting device 1 and the inner edge 80*b* of the second light reflective member 80. While maintaining the light distribution in the second direction Y in which the second distance Py between the light-emitting devices 1 is short, the luminance difference between the arrangement region (opening 80*a*) of each of the light-emitting devices 1 and the region between the light-emitting devices 1 is reduced in the first direction X in which the first distance Px between the light-emitting devices 1 is long, so that luminance unevenness on a light-emitting surface of the planar light source can be reduced.

Figure 19:
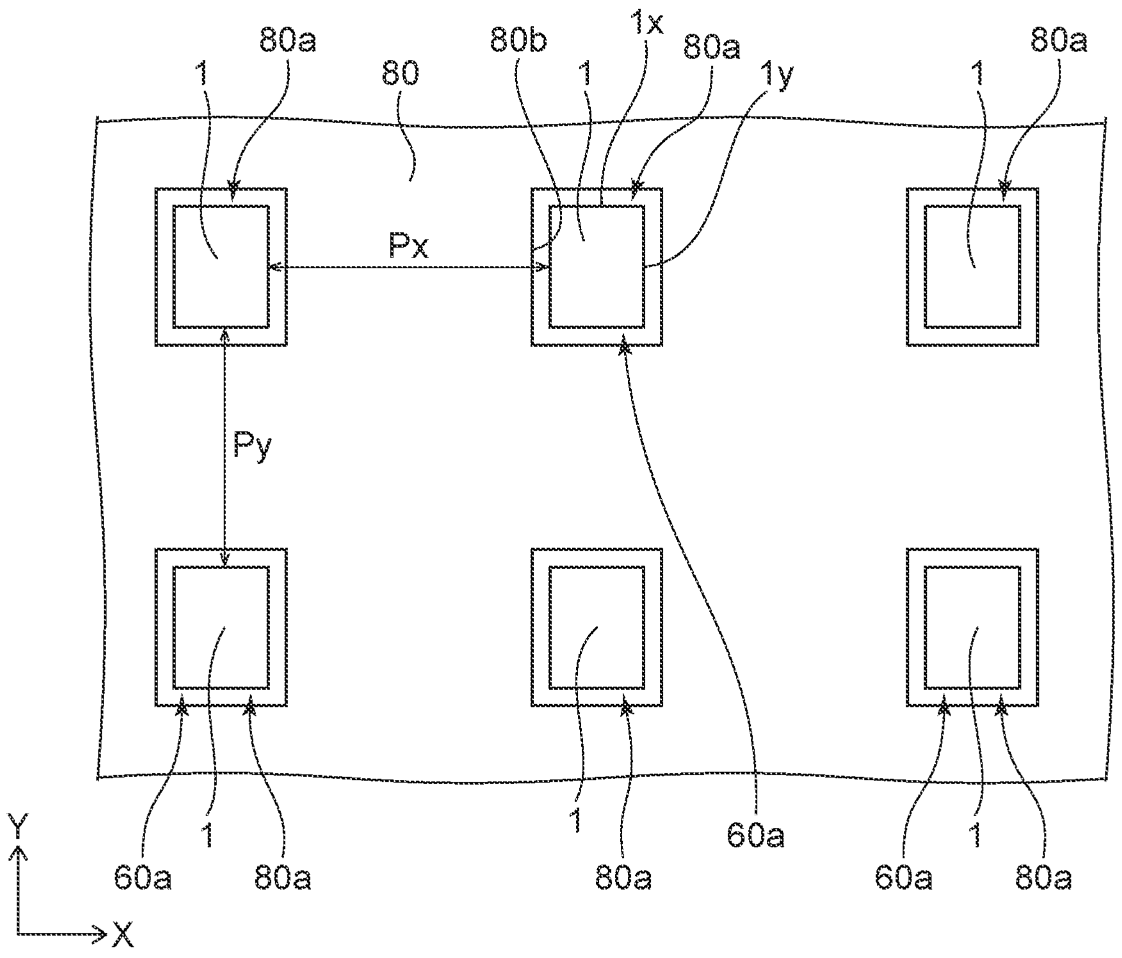
FIG. 19 is a schematic top view of a planar light source according to a fourth modified example of an embodiment.

As illustrated in FIG. 19, the shape of the light-emitting device 1 in top view may be rectangular. In top view, an outer edge 1*x* of the light-emitting device 1 extending in the first direction X is shorter than an outer edge 1*y* thereof extending in the second direction Y. When the first distance Px is longer than the second distance Py, the light-emitting device 1 is disposed such that a lateral surface having a larger area faces the first direction X. Thus, more light can be emitted in the first direction X in which the distance between the light-emitting devices 1 is long, and luminance unevenness on a light-emitting surface of the planar light source can be reduced.

Figure 20:
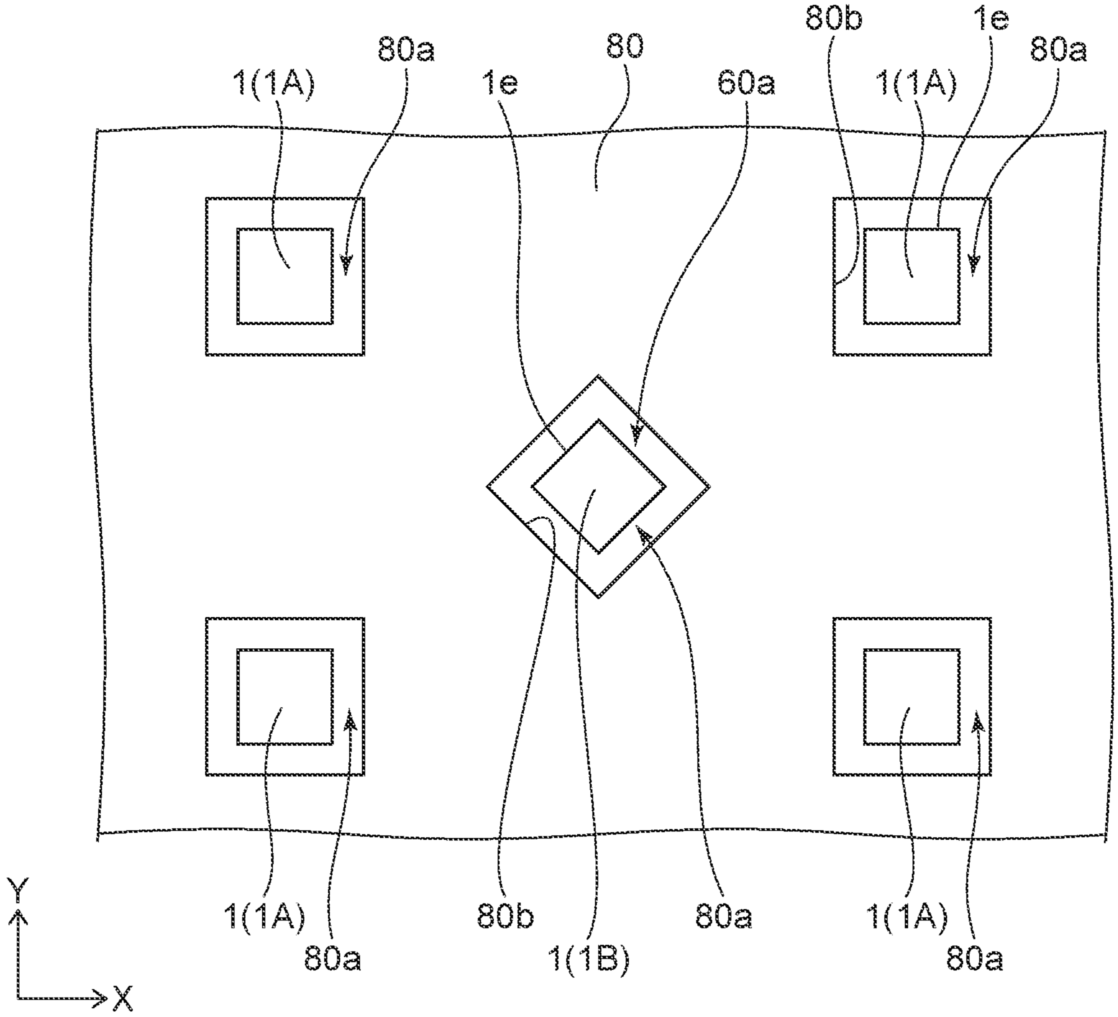
FIG. 20 is a schematic top view of a planar light source according to a fifth modified example of an embodiment.

As illustrated in FIG. 20, the planar light source can include light-emitting devices 1A and light-emitting device(s) 1B. The light-emitting devices 1A each have the outer edge 1*e* extending in the first direction X and the second direction Y, and are each disposed in the opening 80*a* defined by the inner edge 80*b* of the second light reflective member 80 extending in the first direction X and the second direction Y. The light-emitting device 1B is disposed at 45° rotated from the orientation of the light-emitting device 1A in top view. For example, the light-emitting device 1B can be located at the center of a quadrangle connecting the centers of four light-emitting devices 1A in top view. An angle of the light-emitting device 1B with respect to the orientation of the light-emitting device 1A is not limited to 45°, and may be, for example, 22.5°.

Two or more of the modified examples illustrated in FIGS. 16 to 20 described above may be combined with each other.

Embodiments of the present invention have been described above with reference to specific examples. However, the present invention is not limited to these specific examples. All aspects that can be practiced by a person skilled in the art changing the design as appropriate based on the above-described embodiments of the present invention are also included in the scope of the present disclosure, as long as they encompass the spirit of the present disclosure. In addition, in the spirit of the present invention, a person skilled in the art can conceive of various modified examples and modifications, and those modified examples and modifications will also fall within the scope of the present invention.

What is claimed is:

1. A planar light source comprising:
- a light-emitting device comprising:
  - a light-emitting element comprising an element portion, and an electrode disposed on a lower surface of the element portion,
  - a wavelength conversion member disposed on an upper surface and a lateral surface of the element portion,
  - a light-transmissive member disposed on an upper surface of the wavelength conversion member, and
  - a first light reflective member disposed on the lower surface of the element portion and a lower surface of the wavelength conversion member, wherein:
  - a lateral surface of the wavelength conversion member and a lateral surface of the light-transmissive member are coplanar;
- a substrate; and
- a second light reflective member that has an opening and is disposed on an upper surface of the substrate, wherein:
- the light-emitting device is disposed on the upper surface of the substrate in the opening,
- the upper surface of the substrate includes an exposed portion exposed from the light-emitting device in the opening,
- the lateral surface of the wavelength conversion member is exposed from the light-transmissive member, and
- a thickness of the light-transmissive member is larger than a thickness of the wavelength conversion member.

2. The planar light source according to claim 1, wherein, when the thickness of the light-transmissive member is x1, the thickness of the wavelength conversion member is x2, and an area of the exposed portion is x3, $y=1.02+(-2.59\times10^{-5}\times x1)+(-1.95\times10^{-5}\times x2)+(-0.00400\times x3)$ satisfies a range from 0.99 to 1.01.

3. The planar light source according to claim 2, wherein a distance between the upper surface of the element portion and the upper surface of the wavelength conversion member is longer than a distance between the lateral surface of the element portion and the lateral surface of the wavelength conversion member.

4. The planar light source according to claim 2, wherein:
- the light-emitting device has an outer edge having a square shape in top view, and
- a ratio of a total thickness of the light-emitting device to one side of the outer edge having the square shape of the light-emitting device is in a range from 1 to 2.

5. The planar light source according to claim 2, wherein the light-emitting device has a light distribution characteristic of having a first luminous intensity peak higher than a luminous intensity at a light distribution angle of 0°, in a range of a light distribution angle of 0° to −90°, and a second luminous intensity peak higher than a luminous intensity at the light distribution angle of 0°, in a range of a light distribution angle of 0° to 90°.

6. The planar light source according to claim 1, wherein a distance between the upper surface of the element portion and the upper surface of the wavelength conversion member is longer than a distance between the lateral surface of the element portion and the lateral surface of the wavelength conversion member.

7. The planar light source according to claim 1, wherein:
- the light-emitting device has an outer edge having a square shape in top view, and
- a ratio of a total thickness of the light-emitting device to one side of the outer edge having the square shape of the light-emitting device is in a range from 1 to 2.

8. The planar light source according to claim 1, wherein the light-emitting device has a light distribution characteristic of having a first luminous intensity peak higher than a luminous intensity at a light distribution angle of 0°, in a range of a light distribution angle of 0° to −90°, and a second luminous intensity peak higher than a luminous intensity at the light distribution angle of 0°, in a range of a light distribution angle of 0° to 90°.

9. A planar light source comprising:
- a light-emitting device comprising:
  - a light-emitting element comprising an element portion, and an electrode disposed on a lower surface of the element portion,
  - a wavelength conversion member disposed on an upper surface and a lateral surface of the element portion, and
  - a light-transmissive member that comprises a light-diffusing material and is disposed on an upper surface of the wavelength conversion member, wherein:
  - a lateral surface of the wavelength conversion member and a lateral surface of the light-transmissive member are coplanar;
- a substrate; and
- a second light reflective member that has an opening and is disposed on an upper surface of the substrate, wherein:
- the light-emitting device is disposed on the upper surface of the substrate in the opening,
- the upper surface of the substrate includes an exposed portion exposed from the light-emitting device in the opening,
- a thickness of the light-transmissive member is larger than a thickness of the wavelength conversion member, and
- the light-emitting device has a light distribution characteristic of having a first luminous intensity peak higher than a luminous intensity at a light distribution angle of 0°, in a range of a light distribution angle of 0° to −90°, and a second luminous intensity peak higher than a luminous intensity at the light distribution angle of 0°, in a range of a light distribution angle of 0° to 90°.

10. The planar light source according to claim 9, wherein the light-diffusing material in the light-transmissive member has a concentration in a range from 13 wt % to 40 wt %.

* * * * *